United States Patent
Wasaki et al.

(10) Patent No.: US 7,256,662 B2
(45) Date of Patent: Aug. 14, 2007

(54) COMMON MODE SIGNAL SUPPRESSING CIRCUIT AND NORMAL MODE SIGNAL SUPPRESSING CIRCUIT

(75) Inventors: Masaru Wasaki, Ichihara (JP); Hitomi Wasaki, Ichihara (JP); Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 216 days.

(21) Appl. No.: 10/524,661

(22) PCT Filed: Aug. 11, 2003

(86) PCT No.: PCT/JP03/10208

§ 371 (c)(1),
(2), (4) Date: Feb. 11, 2005

(87) PCT Pub. No.: WO2004/017515

PCT Pub. Date: Feb. 26, 2004

(65) Prior Publication Data

US 2005/0285693 A1 Dec. 29, 2005

(30) Foreign Application Priority Data

Aug. 19, 2002 (JP) ............................. 2002-238514
Aug. 19, 2002 (JP) ............................. 2002-238515

(51) Int. Cl.
*H04B 3/28* (2006.01)
(52) U.S. Cl. ......................... 333/12; 333/181; 333/185
(58) Field of Classification Search ................ 333/12, 333/181–185; 336/211, 215
See application file for complete search history.

(56) References Cited

U.S. PATENT DOCUMENTS

| 4,667,173 A | * | 5/1987 | Okochi ....................... 333/177 |
| 4,903,006 A | | 2/1990 | Boomgaard |
| 4,910,482 A | * | 3/1990 | Takagai et al. ............. 333/181 |
| 5,831,842 A | | 11/1998 | Ogasawara et al. |
| 5,969,583 A | * | 10/1999 | Hutchison ................... 333/181 |
| 2002/0063474 A1 | | 5/2002 | Wasaki et al. |

FOREIGN PATENT DOCUMENTS

| JP | A-53-054447 | 5/1978 |
| JP | Y2-57-8247 | 2/1982 |
| JP | A-02-078327 | 3/1990 |
| JP | A-02-206360 | 8/1990 |

(Continued)

*Primary Examiner*—Robert Pascal
*Assistant Examiner*—Kimberly E Glenn
(74) *Attorney, Agent, or Firm*—Oliff & Berridge, PLC

(57) ABSTRACT

A common mode signal suppressing circuit comprises: a first winding (11) inserted to a conductor line (3); a second winding (12) that is inserted to a conductor line (4) and coupled to the first winding (11) through a magnetic core (10) and that suppresses common mode signals in cooperation with the first winding (11); and a third winding (13) coupled to the first and second windings (11, 12) through the core (10). The common mode signal suppressing circuit further comprises a phase-inverted signal transmitting circuit (15) connected to the third winding (13) and to the conductor lines (3, 4). The phase-inverted signal transmitting circuit (15) detects a common mode signal on the conductor lines (3, 4), and supplies a phase-inverted signal to the third winding (13), the phase-inverted signal having a phase opposite to the phase of the common mode signal.

13 Claims, 9 Drawing Sheets

FOREIGN PATENT DOCUMENTS

| | | |
|---|---|---|
| JP | A-02-241233 | 9/1990 |
| JP | A-05-153782 | 6/1993 |
| JP | U-06-36330 | 5/1994 |
| JP | A-07-022886 | 1/1995 |
| JP | A-07-115339 | 5/1995 |
| JP | A-08-032394 | 2/1996 |
| JP | A-08-098536 | 4/1996 |
| JP | A-09-102723 | 4/1997 |
| JP | A-09-116367 | 5/1997 |
| JP | A-10-094244 | 4/1998 |
| JP | A-10-303674 | 11/1998 |
| JP | A-11-154843 | 6/1999 |
| JP | A-11-242063 | 9/1999 |
| JP | A-2000-201044 | 7/2000 |
| JP | A-2002-204189 | 7/2002 |

* cited by examiner

COMMON MODE SIGNAL SUPPRESSING CIRCUIT AND NORMAL MODE SIGNAL SUPPRESSING CIRCUIT

TECHNICAL FIELD

The present invention relates to a common mode signal suppressing circuit for suppressing common mode signals with identical phases propagating through two conductor lines and to a normal mode signal suppressing circuit for suppressing normal mode signals transmitted by conductor lines.

BACKGROUND ART

Power electronics apparatuses such as a switching power supply, an inverter and a lighting circuit of a lighting fixture incorporate a power transformer circuit for transforming power. The power transformer circuit incorporates a switching circuit for transforming a direct current to an alternating current having rectangular waves. Consequently, the power transformer circuit develops a ripple voltage having a frequency equal to the switching frequency of the switching circuit, and noise resulting from the switching operation of the switching circuit. Such a ripple voltage and noise affect other apparatuses. It is therefore required to provide a means for reducing the ripple voltage and noise between the power transformer circuit and the other apparatuses or lines.

LC filters, that is, filters each incorporating an inductance element (an inductor) and a capacitor, are often used as a means for reducing a ripple voltage and noise. The LC filters include a T filter and a π filter, in addition to the one incorporating an inductance element and a capacitor. A typical noise filter for suppressing electromagnetic interference (EMI) is a type of LC filters, too. A typical EMI filter is made up of a combination of discrete elements such as a common mode choke coil, a normal mode choke coil, an X capacitor, and a Y capacitor.

Recently, power line communications have been developed as a potential communications technique used for creating a communications network at home. Through the power line communications, high-frequency signals are superimposed on a power line to perform communications. When the power line communications are performed, noise emerges on the power line because of the operations of various electric and electronic apparatuses connected to the power line, which causes a reduction in quality of communications, such as an increase in error rate. It is therefore required to provide a means for reducing noise on the power line. Moreover, it is required for the power line communications to prevent communications signals on an indoor power line from leaking to an outdoor power line. The LC filters are used as a means for reducing noise on the power line and for preventing communications signals on the indoor power line from leaking to the outdoor power line as thus described, too.

There are two types of noise propagating along two conductor lines: one is normal mode noise that creates a potential difference between the two conductor lines, while the other is common mode noise that propagates along the two conductor lines with identical phases.

FIG. 17 illustrates an example of configuration of an LC filter for reducing common mode noise. The LC filter comprises: a pair of terminals 201a and 201b; another pair of terminals 202a and 202b; a common mode choke coil 203 provided between the terminals 201a, 201b and the terminals 202a, 202b; a capacitor 204 having an end connected to the terminal 201a and the other end grounded; and a capacitor 205 having an end connected to the terminal 201b and the other end grounded.

The common mode choke coil 203 has one magnetic core 203a and two windings 203b and 203c wound around the core 203a. The winding 203b has an end connected to the terminal 201a and the other end connected to the terminal 202a. The winding 203c has an end connected to the terminal 201b and the other end connected to the terminal 202b. The windings 203b and 203c are wound around the core 203a in such directions that, when magnetic fluxes are induced in the core 203a by currents flowing through the windings 203b and 203c when a normal mode current is fed to the windings 203b and 203c, these fluxes are cancelled out by each other.

The LC filter of FIG. 17 is inserted somewhere along the two conductor lines for transmitting power. The terminals 201a and 202a are connected to one of the conductor lines while the terminals 201b and 202b are connected to the other one of the conductor lines.

Next, FIG. 18 illustrates an example of configuration of an LC filter for reducing normal mode noise. The LC filter comprises: a pair of terminals 301a and 301b; another pair of terminals 302a and 302b; a coil 303 as an inductance element; and a capacitor 304. The terminal 302b is connected to the terminal 301b. The coil 303 has an end connected to the terminal 301a and the other end connected to the terminal 302a. The capacitor 304 has an end connected to the other end of the coil 303 and to the terminal 302a. The capacitor 304 has the other end connected to the terminals 301b and 302b.

The LC filter of FIG. 18 is inserted somewhere along the two conductor lines for transmitting power. The terminals 301a and 302a are connected to one of the conductor lines while the terminals 301b and 302b are connected to the other one of the conductor lines.

The Published Unexamined Japanese Patent Application Heisei 9-102723 (1997) discloses a line filter using a transformer. The line filter comprises the transformer and a filter circuit. The transformer incorporates a secondary winding inserted to one of two conductor lines for transmitting power from an alternating power supply to a load. The filter circuit has two inputs connected to ends of the alternating power supply, and two outputs connected to ends of a primary winding of the transformer. In the line filter, the filter circuit extracts noise components from the supply voltage and supplies the noise components to the primary winding of the transformer, so that the noise components are subtracted from the supply voltage on the conductor line to which the secondary winding of the transformer is inserted. The line filter reduces normal mode noise.

The conventional LC filters have a problem that, since the filters have a specific resonant frequency determined by the inductance and the capacitance, a desired amount of attenuation is obtained only within a narrow frequency range.

For the filter inserted to the conductor line for transmitting power, it is required that desired characteristics be obtained while the current for transmitting power is fed, and that a measure for coping with a rise in temperature be provided. Therefore, such a filter has a problem that the inductance element is increased in size for implementing the desired characteristics.

According to the line filter disclosed in the Published Unexamined Japanese Patent Application Heisei 9-102723, it is theoretically possible to remove noise components completely as long as the impedance of the filter circuit is zero and the coupling coefficient of the transformer is 1. In practice, however, it is impossible that the impedance of the filter circuit is zero, and furthermore, the impedance changes in response to the frequency. In particular, if the filter circuit is made up of a capacitor, a series resonant circuit is made up of the capacitor and the primary winding of the transformer. Therefore, the impedance of the signal path including the capacitor and the primary winding of the transformer is reduced only in a narrow frequency range around the resonant frequency of the series resonant circuit. As a result, the line filter is capable of removing noise components only in a narrow frequency range. In addition, the coupling coefficient of the transformer is smaller than 1 in practice. Therefore, the noise components supplied to the primary winding of the transformer will not be completely subtracted from the supply voltage. Because of these reasons, the line filter actually designed has a problem that it is not capable of effectively reducing noise components in a wide frequency range.

DISCLOSURE OF THE INVENTION

It is a first object of the invention to provide a common mode signal suppressing circuit for effectively suppressing common mode signals in a wide frequency range and for achieving a reduction in size.

It is a second object of the invention to provide a normal mode signal suppressing circuit for effectively suppressing normal mode signals in a wide frequency range and for achieving a reduction in size.

A common mode signal suppressing circuit of the invention is a circuit for suppressing common mode signals propagating with identical phases through two conductor lines. The common mode signal suppressing circuit comprises: a first winding inserted to one of the conductor lines at a specific first point; a second winding that is inserted to the other of the conductor lines at a second point corresponding to the first point and is coupled to the first winding, the second winding suppressing the common mode signals in cooperation with the first winding; a third winding coupled to the first and second windings such that a mutual inductance is generated between the third winding and the first and second windings; and a phase-inverted signal transmitting means connected to the third winding and to the one of the conductor lines at a third point different from the first point, the transmitting means being further connected to the other of the conductor lines at a fourth point corresponding to the third point and different from the second point, the transmitting means transmitting a phase-inverted signal for suppressing the common mode signals.

In the common mode signal suppressing circuit of the invention, when a source of the common mode signals is located at a point closer to the third and fourth points than the first and second points except a point between the first and third points and a point between the second and fourth points, the transmitting means detects a common mode signal and supplies the phase-inverted signal to the third winding, the phase-inverted signal having a phase opposite to a phase of the common mode signal detected. In addition, the third winding injects the phase-inverted signal to the two conductor lines through the first and second windings. As a result, the common mode signal is suppressed on portions of the two conductor lines from the first and second points onward along the direction of travel of the common mode signal.

In the common mode signal suppressing circuit of the invention, when the source of the common mode signals is located at a point closer to the first and second points than the third and fourth points except a point between the first and third points and a point between the second and fourth points, the third winding detects a common mode signal, and the transmitting means injects the phase-inverted signal to the two conductor lines, the phase-inverted signal having a phase opposite to the phase of the common mode signal detected by the third winding. As a result, the common mode signal is suppressed on portions of the two conductor lines from the third and fourth points onward along the direction of travel of the common mode signal.

The common mode signal suppressing circuit of the invention may further comprise an impedance element provided on the two conductor lines at a point between the first and third points and a point between the second and fourth points, the impedance element reducing the peak value of a common mode signal passing therethrough.

In the common mode signal suppressing circuit of the invention, the phase-inverted signal transmitting means may incorporate a high-pass filter for allowing a common mode signal to pass therethrough. The high-pass filter may incorporate a capacitor.

In the common mode signal suppressing circuit of the invention, the impedance element may incorporate: a fourth winding inserted to one of the conductor lines; and a fifth winding that is inserted to the other of the conductor lines and coupled to the fourth winding and that suppresses the common mode signals in cooperation with the fourth winding. Each of the fourth and fifth windings may have an inductance of 0.3 µH or greater.

In the common mode signal suppressing circuit of the invention, the coupling coefficient between the third winding and the first and second windings may be 0.7 or greater.

A normal mode signal suppressing circuit of the invention is a circuit for suppressing normal mode signals transmitted by two conductor lines and creating a potential difference between the two conductor lines. The normal mode signal suppressing circuit comprises: a first inductance element inserted to one of the conductor lines at a specific first point; a second inductance element coupled to the first inductance element such that a mutual inductance is generated between the first and second inductance elements; a phase-inverted signal transmitting means connected to the second inductance element and to the one of the conductor lines at a second point different from the first point, the transmitting means transmitting a phase-inverted signal for suppressing the normal mode signals; and an impedance element provided on the one of the conductor lines at a point between the first and second points, the impedance element reducing a peak value of a normal mode signal passing therethrough.

In the normal mode signal suppressing circuit of the invention, when a source of the normal mode signals is located at a point closer to the second point than the first point except a point between the first and second points, the transmitting means detects a normal mode signal and supplies the phase-inverted signal to the second inductance element, the phase-inverted signal having a phase opposite to the phase of the normal mode signal detected. In addition, the second inductance element injects the phase-inverted signal to the one of the conductor lines through the first inductance element. As a result, the normal mode signal is suppressed on a portion of the one of the conductor lines from the first point onward along the direction of travel of the normal mode signal.

In the normal mode signal suppressing circuit of the invention, when the source of the normal mode signals is located at a point closer to the first point than the second point except a point between the first and second points, the second inductance element detects a normal mode signal, and the transmitting means injects the phase-inverted signal to the one of the conductor lines, the phase-inverted signal having a phase opposite to a phase of the normal mode signal detected by the second inductance element. As a result, the normal mode signal is suppressed on a portion of the one of the conductor lines from the second point onward along the direction of travel of the normal mode signal.

In the normal mode signal suppressing circuit of the invention, the impedance element reduces the peak value of the normal mode signal passing therethough, which reduces the difference between the peak value of the normal mode signal propagating via the impedance element and the peak value of the phase-inverted signal injected to the one of the conductor lines via the phase-inverted signal transmitting means.

In the normal mode signal suppressing circuit of the invention, the phase-inverted signal transmitting means may incorporate a high-pass filter for allowing a normal mode signal to pass therethrough. The high-pass filter may incorporate a capacitor. The high-pass filter may incorporate a plurality of capacitors that are combined.

In the normal mode signal suppressing circuit of the invention, the impedance element may incorporate a third inductance element inserted to the one of the conductor lines. The third inductance element may have an inductance of 0.3 µH or greater.

In the normal mode signal suppressing circuit of the invention, the coupling coefficient between the first and second inductance elements may be 0.7 or greater.

Other and further objects, features and advantages of the invention will appear more fully from the following description.

BEST MODE FOR CARRYING OUT THE INVENTION

Preferred embodiments of the invention will now be described in detail with reference to the accompanying drawings.

FIRST EMBODIMENT

Figure 1:
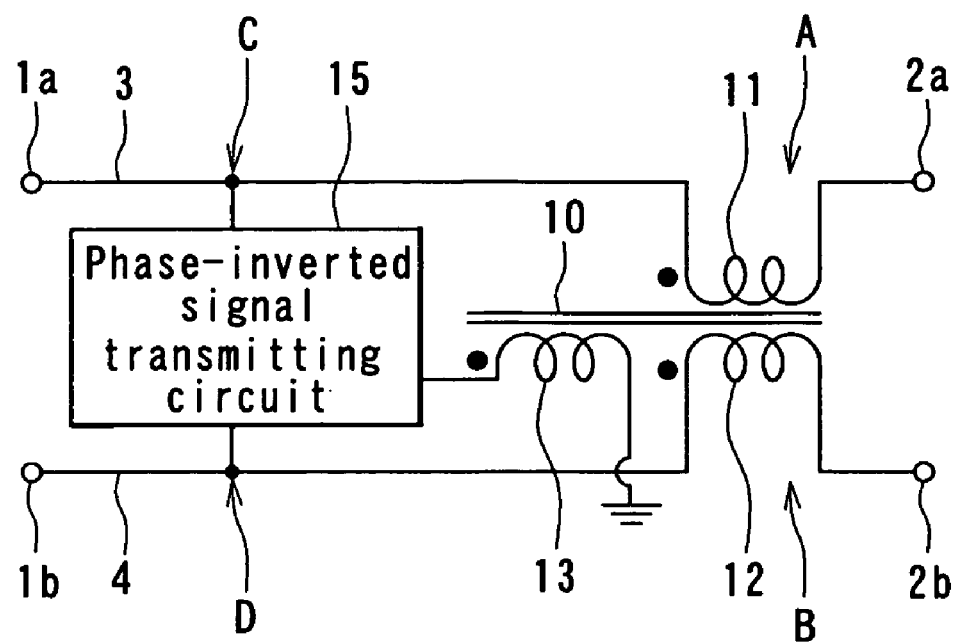
FIG. 1 is a schematic diagram illustrating a basic configuration of a common mode signal suppressing circuit of a first embodiment of the invention.

FIG. 1 is a schematic diagram illustrating a basic configuration of a common mode signal suppressing circuit of a first embodiment of the invention. The common mode signal suppressing circuit of the embodiment comprises a pair of terminals 1a and 1b, another pair of terminals 2a and 2b, a conductor line 3 connecting the terminals 1a and 2a to each other, and a conductor line 4 connecting the terminals 1b and 2b to each other. The common mode signal suppressing circuit is designed to be connected to a power line for transmitting alternating current power or direct current power. The power line includes two power conductor lines. The common mode signal suppressing circuit is designed to be inserted somewhere along the two power conductor lines. The terminals 1a and 2a are connected to one of the power conductor lines while the terminals 1b and 2b are connected to the other of the power conductor lines. A source of common mode signals to be suppressed by the common mode signal suppressing circuit is connected to the terminals 1a and 1b or the terminals 2a and 2b. Therefore, the common mode signals to be suppressed are inputted to the common mode signal suppressing circuit from the terminals 1a and 1b or the terminals 2a and 2b.

Here, the common mode signals are signals propagating through the two power conductor lines with identical phases. The common mode signals to be suppressed include noise and unwanted communications signals.

The common mode signal suppressing circuit further comprises: a first winding 11 inserted to the conductor line 3 at a specific first point A; a second winding 12 that is inserted to the conductor line 4 at a second point B corresponding to the first point A and is coupled to the first winding 11 through a magnetic core 10 and that suppresses common mode signals in cooperation with the first winding 11; and a third winding 13 coupled to the first winding 11 and the second winding 12 through the core 10 such that a mutual inductance is generated between the third winding 13 and the first and second windings 11, 12. For example, the numbers of turns of the windings 11, 12 and 13 may be equal. The core 10, the first winding 11 and the second winding 12 make up a common mode choke coil. That is, the windings 11 and 12 are wound around the core 10 in such directions that, when magnetic fluxes are induced in the core 10 by currents flowing through the windings 11 and 12 when a normal mode current is fed to the windings 11 and 12, these fluxes are cancelled out by each other. The windings 11 and 12 thereby suppress common mode signals and allow normal mode signals to pass.

The common mode signal suppressing circuit further comprises a phase-inverted signal transmitting circuit 15 connected to the third winding 13 and to the conductor line 3 at a third point C different from the first point A, and furthermore, to the conductor line 4 at a fourth point D corresponding to the third point C and different from the second point B. The phase-inverted signal transmitting circuit 15 transmits phase-inverted signals for suppressing common mode signals. The phase-inverted signal transmitting circuit 15 has first to third terminals. The first terminal is connected to the conductor line 3 at the third point C. The second terminal is connected to the conductor line 4 at the fourth point D. The third terminal is connected to an end of the third winding 13. The other end of the third winding 13 is grounded. The phase-inverted signal transmitting circuit 15 corresponds to the phase-inverted signal transmitting means of the invention.

Figure 2:
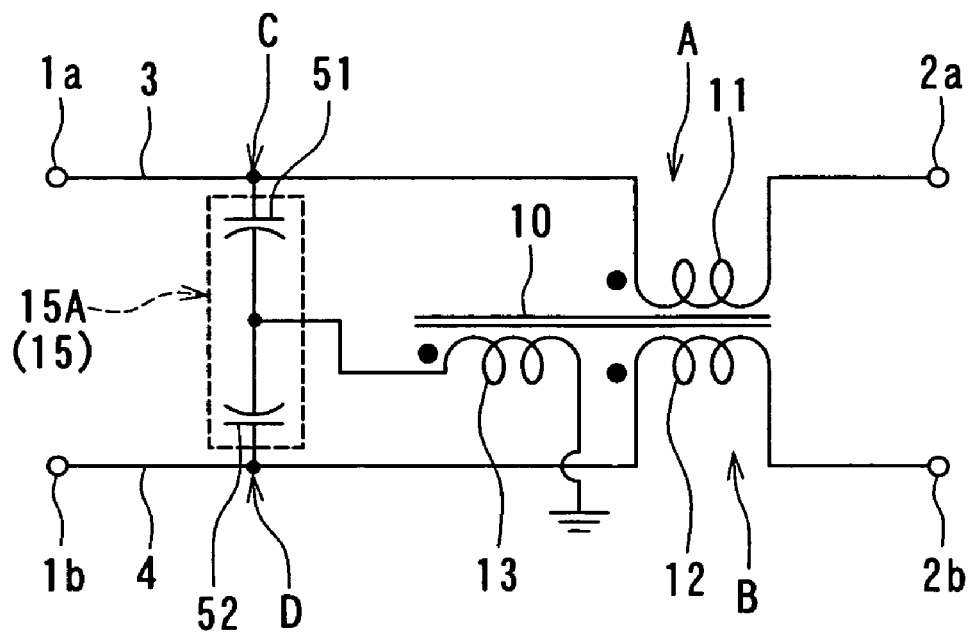
FIG. 2 is a schematic diagram illustrating a specific example of configuration of the common mode signal suppressing circuit of FIG. 1.

FIG. 2 is a schematic diagram illustrating a specific example of configuration of the common mode signal suppressing circuit of FIG. 1. In this example, the phase-inverted signal transmitting circuit 15 is made up of a high-pass filter 15A for allowing signals having a specific frequency or higher to pass among common mode signals or phase-inverted signals. The high-pass filter 15A includes capacitors 51 and 52. The capacitor 51 has an end connected to the conductor line 3 at the point C. The capacitor 52 has an end connected to the conductor line 4 at the point D. The other end of each of the capacitors 51 and 52 is connected to an end of the third winding 13.

The operation of the common mode signal suppressing circuit of the embodiment will now be described. First, the operation of the common mode signal suppressing circuit will be described, wherein the common mode signal source is located at a point closer to the third and fourth points C and D than the first and second points A and B except a point between the first point A and the third point C and a point between the second point B and the fourth point D. In this case, the phase-inverted signal transmitting circuit 15 detects a common mode signal at the third and fourth points C and D, and supplies a phase-inverted signal to the third winding 13, the phase-inverted signal having a phase opposite to the phase of the common mode signal detected. The third winding 13 injects the phase-inverted signal to the two conductor lines 3 and 4 at the first and second points A and B through the first winding 11 and the second winding 12. As a result, the common mode signal is suppressed on portions of the two conductor lines 3 and 4 from the first and second points A and B onward, respectively, along the direction of travel of the common mode signal.

Next, the operation of the common mode signal suppressing circuit will be described, wherein the common mode signal source is located at a point closer to the first and second points A and B than the third and fourth points C and D except a point between the first point A and the third point C and a point between the second point B and the fourth point D. In this case, the third winding 13 detects a common mode signal on the conductor lines 3 and 4 at the first and second points A and B. The phase-inverted signal transmitting circuit 15 injects a phase-inverted signal to the two conductor lines 3 and 4 at the third and fourth points C and D, the phase-inverted signal having a phase opposite to the phase of the common mode signal detected by the third winding 13. As a result, the common mode signal is suppressed on portions of the two conductor lines 3 and 4 from the third and fourth points C and D onward, respectively, along the direction of travel of the common mode signal.

Figure 3:
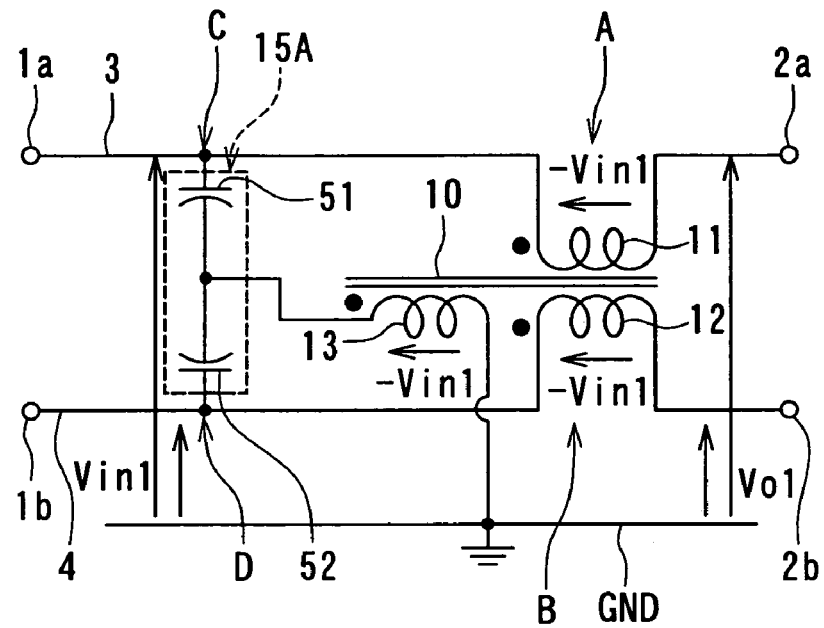
FIG. 3 is a schematic diagram for illustrating the principle of suppression of common mode signals by the common mode signal suppressing circuit of the first embodiment of the invention.

Reference is now made to FIG. 3 to describe the principle of suppression of common mode signals by the common mode signal suppressing circuit of the embodiment. Here, a case will be described, wherein the common mode signal source is located at a point closer to the third and fourth points C and D than the first and second points A and B. FIG. 3 illustrates the common mode signal suppressing circuit having a configuration similar to that of FIG. 2. In the following description, it is assumed that the impedance of the high-pass filter 15A (the capacitors 51 and 52) is zero, the numbers of turns of the windings 11 to 13, for example, are equal, and the coupling coefficient between the winding 13 and the windings 11 and 12 is 1.

It is assumed that, in the common mode signal suppressing circuit of FIG. 3, a common mode signal that creates a potential difference Vin1 in the potential of the ground GND is inputted to the terminals 1a and 1b. If the common mode signal has a frequency within the pass band of the high-pass filter 15A, the common mode signal passes through the high-pass filter 15A, and a phase shift of 180 degrees occurs at the same time by means of the operation of the capacitors 51 and 52. As a result, a potential difference $-Vin1$ is created between the ends of the third winding 13. A potential difference $-Vin1$ is also created between the ends of the first winding 11 and between the ends of the second winding 12, in accordance with the potential difference $-Vin1$ created between the ends of the third winding 13. This is expressed by the equation below where the difference between the potential of the ground GND and the potential of the terminals 2a and 2b is Vo1.

$$Vo1 = Vin1 + (-Vin1) = 0$$

According to the common mode signal suppressing circuit of FIG. 3 as thus described, as long as the impedance of the high-pass filter 15A is zero and the coupling coefficient between the winding 13 and the windings 11 and 12 is 1, it is possible to completely remove common mode signals at any frequency within the pass band of the high-pass filter 15A. In practice, however, it is impossible that the impedance of the high-pass filter 15A is zero. In addition, the coupling coefficient between the winding 13 and the windings 11 and 12 is smaller than 1. Therefore, the common mode signal suppressing circuit of FIG. 3 is not capable of removing common mode signals completely. Nevertheless, according to the embodiment, it is possible to implement the common mode signal suppressing circuit that is capable of effectively suppressing common mode signals in a wide frequency range and that has a simple configuration to achieve a reduction in size.

Figure 4:
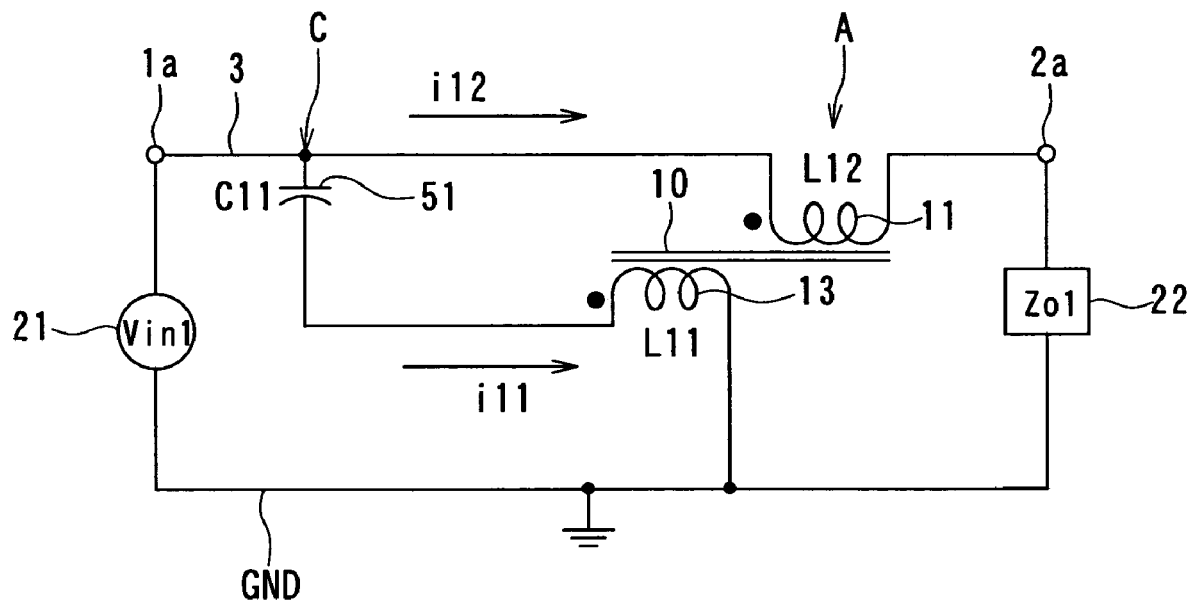
FIG. 4 is a schematic diagram for illustrating the operation of the common mode signal suppressing circuit of the first embodiment of the invention.

Reference is now made to FIG. 4 to describe details of the operation of the common mode signal suppressing circuit of the embodiment. FIG. 4 illustrates a portion of the common mode signal suppressing circuit of FIG. 2 that relates to suppression of signals passing through the conductor line 3. The circuit of FIG. 4 incorporates the terminals 1a and 2a, the first winding 11, the third winding 13 and the capacitor 51. A common mode signal source 21 and a load 22 are connected to the circuit of FIG. 4. The common mode signal source 21 is connected between the terminal 1a and the ground GND, and creates a potential difference Vin1 between the terminal 1a and the ground GND. The load 22 is connected between the terminal 2a and the ground GND, and has an impedance Zo1.

In the circuit of FIG. 4, the inductance of the third winding 13 is L11, the inductance of the first winding 11 is L12, and the capacitance of the capacitor 51 is C11. The current passing through the capacitor 51 and the third winding 13 is 'i11', and the sum of impedances on the path of the current i11 is Z1. The current passing through the first winding 11 is 'i12', and the sum of impedances on the path of the current i12 is Z2.

The mutual inductance between the first winding 11 and the third winding 13 is M, and the coupling coefficient between the first winding 11 and the third winding 13 is K. The coupling coefficient K is expressed by the following equation (1).

$$K = M/\sqrt{(L11 \cdot L12)} \quad (1)$$

The above-mentioned sums Z1 and Z2 of impedances are expressed by the following equations (2) and (3), respectively, where 'j' indicates $\sqrt{(-1)}$, and 'ω' indicates the angular frequency of the common mode signal.

$$Z1 = j(\omega L11 - 1/\omega C11) \quad (2)$$

$$Z2 = Zo1 + j\omega L12 \quad (3)$$

The potential difference Vin1 is expressed by the following equations (4) and (5).

$$Vin1 = Z1 \cdot i11 + j\omega M \cdot i12 \quad (4)$$

$$Vin1 = Z2 \cdot i12 + j\omega M \cdot i11 \quad (5)$$

Based on the equations (2) to (5), an equation that expresses the current 'i12' without including the current 'i11' will be obtained below. First, the following equation (6) is obtained from the equation (4).

$$i11 = (Vin1 - j\omega M \cdot i12)/Z1 \quad (6)$$

Next, the equation (6) is substituted into the equation (5), and the following equation (7) is thereby obtained.

$$i12 = Vin1(Z1 - j\omega M)/(Z1 \cdot Z2 + \omega^2 \cdot M^2) \quad (7)$$

To suppress the common mode signal by the circuit of FIG. 4 means a reduction in current 'i12' expressed by the equation (7). According to the equation (7), the current 'i12' is reduced if the denominator of the right side of the equation (7) increases. Consideration will now be given to the denominator $(Z1 \cdot Z2 + \omega^2 \cdot M^2)$ of the right side of the equation (7).

First, since Z1 is expressed by the equation (2), Z1 increases as the inductance L11 of the third winding 13 increases, and Z1 increases as the capacitance C11 of the capacitor 51 increases.

Next, since Z2 is expressed by the equation (3), Z2 increases as the inductance L12 of the first winding 11 increases. Therefore, the current 'i12' is reduced if the inductance L12 is increased.

Since the denominator of the right side of the equation (7) includes $\omega^2 \cdot M^2$, the current 'i12' is reduced by increasing the mutual inductance M. As shown in the equation (1), the coupling coefficient K is proportional to the mutual inductance M. Therefore, if the coupling coefficient K is increased, the effect of suppressing common mode signals by the circuit of FIG. 4 is enhanced. Since the mutual inductance M is included in a form of square in the denominator of the right side of the equation (7), the effect of suppressing common mode signals greatly varies, depending on the value of coupling coefficient K.

The foregoing description similarly applies to a portion of the common mode signal suppressing circuit of FIG. 2 that relates to suppression of signals passing through the conductor line 4.

If the common mode signal source is located closer to the first and second points A and B than the third and fourth points C and D, the roles of the third winding 13 and the phase-inverted signal transmitting circuit 15 are the reverse of the roles described with reference to FIG. 3 and FIG. 4. However, the foregoing description similarly applies to such a case, too.

According to the embodiment as thus described, it is possible to implement the common mode signal suppressing circuit capable of effectively suppressing common mode signals in a wide frequency range and achieving a reduction in size.

According to the embodiment, it is possible to implement the common mode signal suppressing circuit that has a greater effect of suppressing common mode signals although it has a smaller number of components than a conventional EMI filter does and is inexpensive.

According to the embodiment, if the phase-inverted signal transmitting circuit 15 is made up of the capacitors 51 and 52, it is possible only by the capacitors 51 and 52 to perform detection of common mode signals and generation of phase-inverted signals each having a phase opposite to the phase of each of the common mode signals detected. As a result, the number of components is further reduced in this case.

The common mode signal suppressing circuit of the embodiment may be used as a means for reducing a ripple voltage and noise developed by a power transformer circuit, or a means for avoiding communications signals on an indoor power line from leaking to an outdoor power line.

SECOND EMBODIMENT

Figure 5:
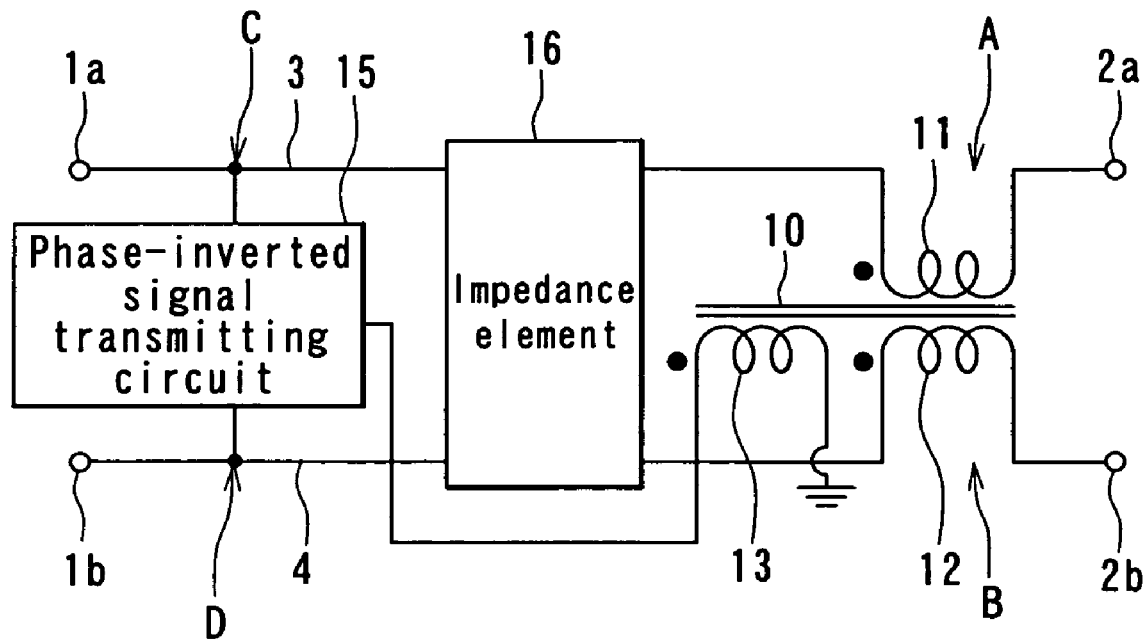
FIG. 5 is a schematic diagram illustrating a basic configuration of a common mode signal suppressing circuit of a second embodiment of the invention.

FIG. 5 is a schematic diagram illustrating a basic configuration of a common mode signal suppressing circuit of a second embodiment of the invention. The common mode signal suppressing circuit of the second embodiment has a configuration of the common mode signal suppressing circuit of the first embodiment to which an impedance element 16 is added. The impedance element 16 is provided at points on the conductor lines 3 and 4 between the first point A and the third point C and between the second point B and the fourth point D. The impedance element 16 reduces the peak value of a common mode signal passing therethrough. As a result, in the common mode signal suppressing circuit of the second embodiment, the difference between the peak value of the common mode signal propagating via the impedance element 16 and the peak value of the phase-inverted signal injected to the conductor lines 3 and 4 via the phase-inverted signal transmitting circuit 15 is reduced. As a result, according to the common mode signal suppressing circuit of the embodiment, it is possible to suppress common mode signals in a wider frequency range more effectively.

Figure 6:
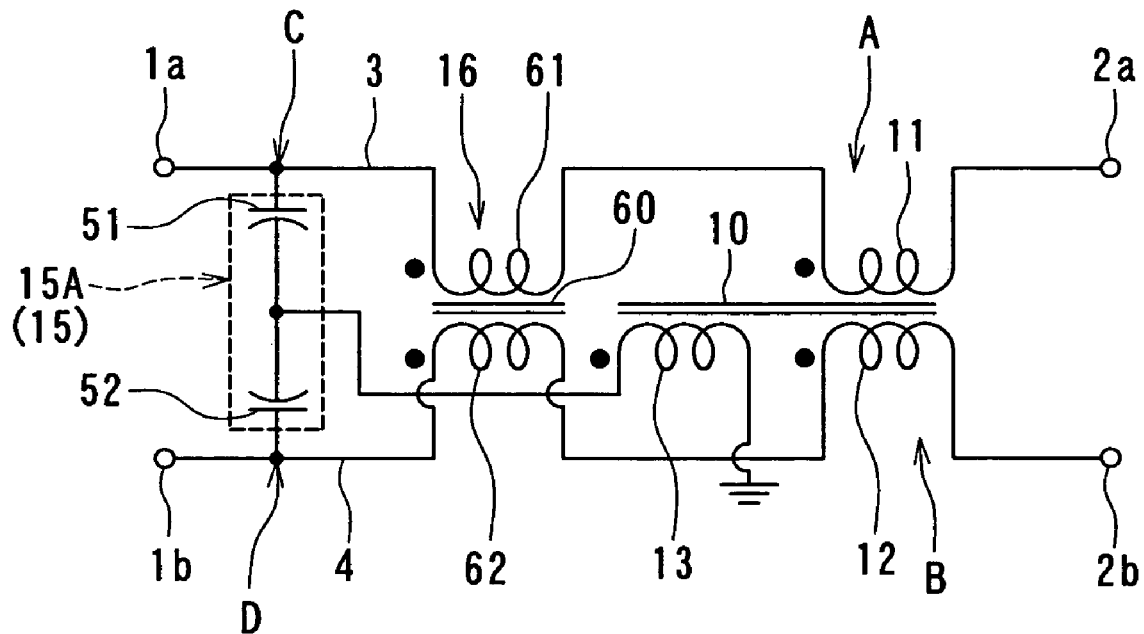
FIG. 6 is a schematic diagram illustrating a specific example of configuration of the common mode signal suppressing circuit of FIG. 5.

FIG. 6 is a schematic diagram illustrating a specific example of configuration of the common mode signal suppressing circuit of FIG. 5. In this example, as in the example illustrated in FIG. 2, the phase-inverted signal transmitting circuit 15 is made up of the high-pass filter 15A. The high-pass filter 15A includes the capacitors 51 and 52.

In the example of FIG. 6, the impedance element 16 incorporates: a fourth winding 61 inserted to the conductor line 3; and a fifth winding 62 that is inserted to the conductor line 4 and coupled to the fourth winding 61 through a magnetic core 60 and that suppresses common mode signals in cooperation with the fourth winding 61. For example, the numbers of windings 61 and 62 may be equal. The core 60 and the windings 61 and 62 make up a common mode choke coil. That is, the windings 61 and 62 are wound around the core 60 in such directions that, when magnetic fluxes are induced in the core 60 by currents flowing through the windings 61 and 62 when a normal mode current is fed to the windings 61 and 62, these fluxes are cancelled out by each other. The windings 61 and 62 thereby suppress common mode signals and allow normal mode signals to pass.

Figure 7:
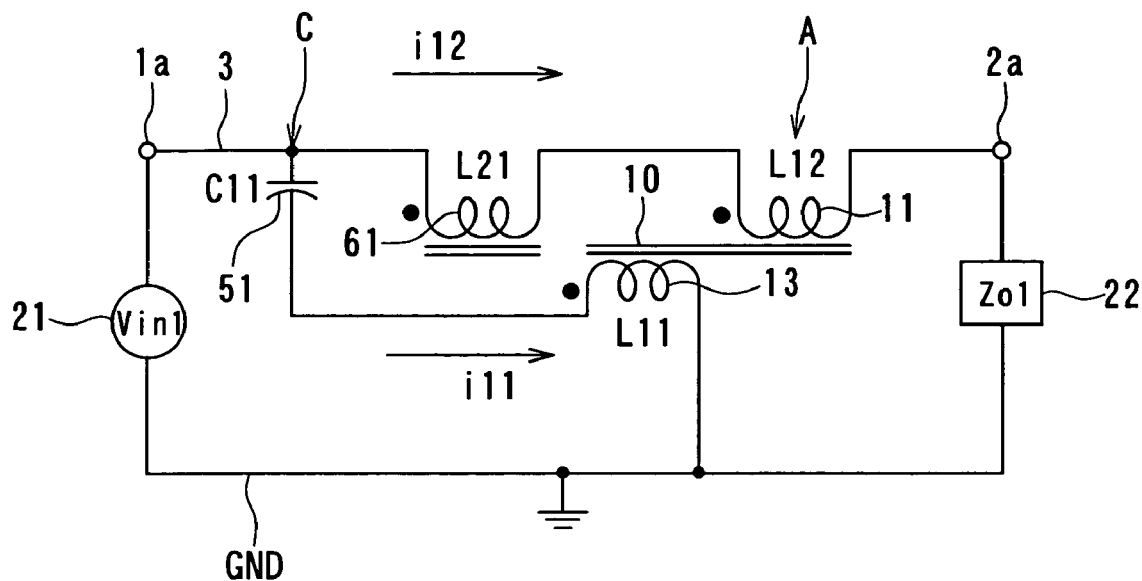
FIG. 7 is a schematic diagram for illustrating the operation of the common mode signal suppressing circuit of the second embodiment of the invention.

Reference is now made to FIG. 7 to describe details of the operation of the common mode signal suppressing circuit of the second embodiment. FIG. 7 illustrates a portion of the common mode signal suppressing circuit of FIG. 6 that relates to suppression of signals passing through the conductor line 3. The circuit of FIG. 7 incorporates the terminals 1a and 2a, the first winding 11, the third winding 13, the capacitor 51 and the fourth winding 61. The common mode signal source 21 and the load 22 are connected to the circuit of FIG. 7. The common mode signal source 21 is connected between the terminal 1a and the ground GND, and creates a potential difference Vin1 between the terminal 1a and the ground GND. The load 22 is connected between the terminal 2a and the ground GND, and has an impedance Zo1.

In the circuit of FIG. 7, the inductance of the third winding 13 is L11, the inductance of the first winding 11 is L12, the capacitance of the capacitor 51 is C11, and the inductance of the fourth winding 61 is L21. The current passing through the capacitor 51 and the third winding 13 is 'i11', and the sum of impedances on the path of the current i11 is Z1. The current passing through the fourth winding 61 and the first winding 11 is 'i12', and the sum of impedances on the path of the current i12 is Z2. The mutual inductance between the first winding 11 and the third winding 13 is M, and the coupling coefficient between the first winding 11 and the third winding 13 is K. The coupling coefficient K is expressed by the above-mentioned equation (1).

In the second embodiment, the sum of impedances Z1 is expressed by the above-mentioned equation (2), and the sum of impedances Z2 is expressed by the following equation (8).

$$Z2=Zo1+j\omega(L12+L21) \qquad (8)$$

The potential difference Vin1 is expressed by the above-mentioned equations (4) and (5). In the second embodiment, the equation that expresses the current 'i12' without including the current 'i11' is the above-mentioned equation (7), as in the first embodiment.

To suppress the common mode signal by the circuit of FIG. 7 means a reduction in current 'i12' expressed by the equation (7). According to the equation (7), the current 'i12' is reduced if the denominator of the right side of the equation (7) increases. Consideration will now be given to the denominator $(Z1 \cdot Z2 + \omega^2 \cdot M^2)$ of the right side of the equation (7).

First, since Z1 is expressed by the equation (2), Z1 increases as the inductance L11 of the third winding 13 increases, and Z1 increases as the capacitance C11 of the capacitor 51 increases. This is the same as described in the first embodiment.

Next, in the circuit of FIG. 7, since Z2 is expressed by the equation (8), Z2 increases as the sum of the inductance L12 of the first winding 11 and the inductance L21 of the fourth winding 61 increases. Therefore, the current 'i12' is reduced if at least one of the inductance L12 and the inductance L21 is increased. In addition, the equation (7) shows that, although it is possible to suppress common mode signals only by the first winding 11, it is possible to suppress common mode signals more effectively by adding the fourth winding 61.

As in the first embodiment, the current 'i12' is reduced by increasing the mutual inductance M.

The foregoing description similarly applies to a portion of the common mode signal suppressing circuit of FIG. 6 that relates to suppression of signals passing through the conductor line 4.

If the common mode signal source is located closer to the first and second points A and B than the third and fourth points C and D, the roles of the third winding 13 and the phase-inverted signal transmitting circuit 15 are the reverse of the roles described with reference to FIG. 7. However, the foregoing description similarly applies to such a case, too.

Figure 8:
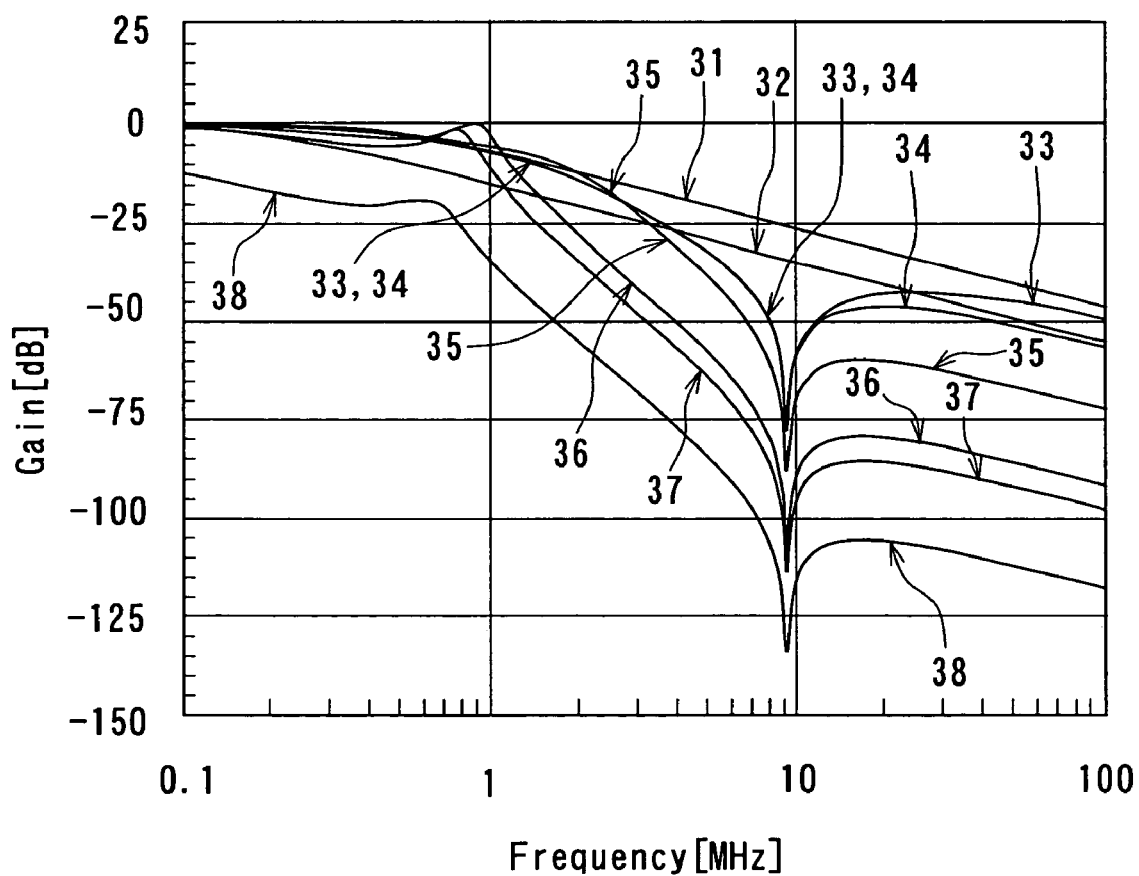
FIG. 8 is a plot showing frequency characteristics of gains obtained by simulation for a reference circuit and the common mode signal suppressing circuit of FIG. 6.

Reference is now made to FIG. 8 to describe the result of determining the relationship between the effect of suppressing common mode signals and the inductances of the windings 61 and 62 of the common mode signal suppressing circuit of FIG. 6 by simulation. FIG. 8 shows frequency characteristics of gains obtained by simulation for a reference circuit and the common mode signal suppressing circuit of FIG. 6.

The reference circuit comprises: a pair of terminals 1a and 1b; another pair of terminals 2a and 2b; a first inductance element having an end connected to the terminal 1a and the other end connected to the terminal 2a; and a second inductance element having an end connected to the terminal 1b and the other end connected to the terminal 2b. A line of FIG. 8 indicated with numeral 31 shows the characteristic of the reference circuit when the inductance of each of the above-mentioned first and second inductance elements is 33 µH. A line of FIG. 8 indicated with numeral 32 shows the characteristic of the reference circuit when the inductance of each of the first and second inductance elements is 90 µH.

Lines of FIG. 8 indicated with numerals 33 to 38 show the characteristics of the common mode signal suppressing circuit of FIG. 6. In the simulation, the capacitance of each of the capacitors 51 and 52 is 1000 pF, the inductance of each of the first winding 11, the second winding 12 and the third winding 13 is 30 µH, and the coupling coefficient between the winding 13 and the windings 11 and 12 is 0.995. The value of 0.995 is a value that can be obtained as the coupling coefficient.

In the simulation no difference in characteristic of the common mode signal suppressing circuit is observed between the case in which the common mode signal source is located at a point closer to the first and second points A and B and the case in which the common mode signal source is located at a point closer to the third and fourth points C and D.

The line indicated with numeral 33 shows the characteristic obtained when the inductance of each of the windings 61 and 62 is zero. The configuration of the common mode signal suppressing circuit of FIG. 6 in this case is the same as the configuration of the common mode signal suppressing circuit of FIG. 2. The line indicated with numeral 34 shows the characteristic obtained when the inductance of each of the windings 61 and 62 is 0.3 µH. The line indicated with numeral 35 shows the characteristic obtained when the inductance of each of the windings 61 and 62 is 3 μH. The line indicated with numeral 36 shows the characteristic obtained when the inductance of each of the windings 61 and 62 is 30 μH. The line indicated with numeral 37 shows the characteristic obtained when the inductance of each of the windings 61 and 62 is 60 μH. The line indicated with numeral 38 shows the characteristic obtained when the inductance of each of the windings 61 and 62 is 600 μH.

The result of the simulation shown in FIG. 8 will now be considered. First, the following facts will be obtained from the comparison among the lines indicated with numerals 31, 32 and 35. The common mode signal suppressing circuit wherein the inductance of the first winding 11 is 30 μH, the inductance of the fourth winding 61 is 3 μH, and the sum of these inductances is 33 μH has a greater effect of suppressing common mode signals in a frequency range of approximately 1 MHz and higher, compared with the reference circuit wherein the inductance of the inductance element is 33 μH. This common mode signal suppressing circuit has a greater effect of suppressing common mode signals in a frequency range of approximately 3 MHz and higher, compared with the reference circuit wherein the inductance of the inductance element is 90 μH. Because of this feature, according to the embodiment, it is possible to make the inductance element smaller, compared with the reference circuit, and it is thereby possible to reduce the entire circuit in size.

If the line with numeral 31 and the line with numeral 33 are compared, it is noted that the effect of suppressing common mode signals is obtained even when the inductance of the windings 61 and 62 is zero, that is, when the impedance element 16 is not provided.

However, as the comparison among the lines with numerals 33 to 38 shows, a greater effect of suppressing common mode signals is obtained when the impedance element 16 is provided, compared with the case in which the impedance element 16 is not provided. Moreover, the effect of suppressing common mode signals increases as the inductance of the windings 61 and 62 increases. However, the impedance element 16 is increased in dimensions as the inductance of the windings 61 and 62 increases. Therefore, if the inductance of the windings 61 and 62 exceeds 600 μH, the practicality is reduced. It is noted that, if the inductance of the windings 11 to 13 is 30 μH, a sufficient effect of suppressing common mode signals is obtained as long as the inductance of the windings 61 and 62 is 30 or 60 μH. These findings indicate that it is sufficient that the inductance of the windings 61 and 62 is 30 or 60 μH. In addition, it would be preferred that the inductance of the windings 61 and 62 is of a value similar to that of the windings 11 to 13.

The consideration of FIG. 8 indicates that the inductance of the windings 61 and 62 should preferably fall within a range of 0.3 μH to 600 μH inclusive, more preferably within a range of 3 μH to 60 μH inclusive, and still more preferably within a range of 3 μH to 30 μH inclusive.

Figure 9:
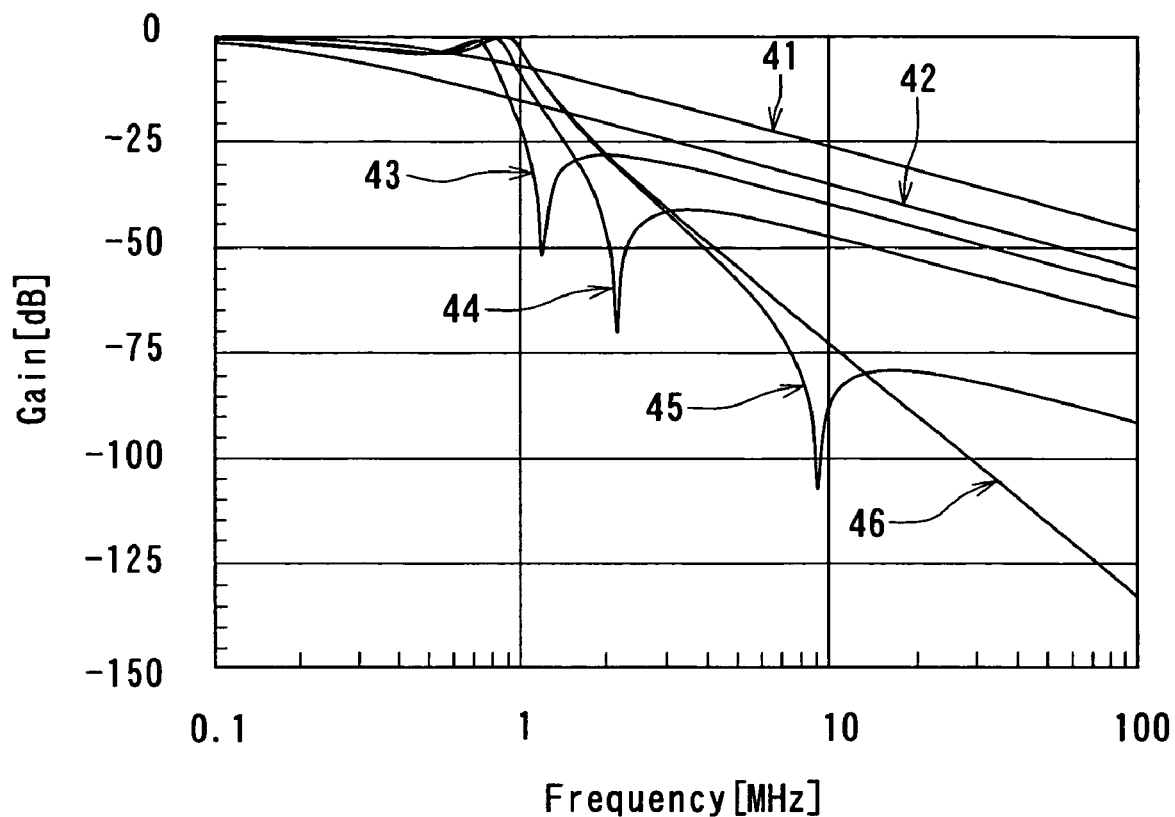
FIG. 9 is a plot showing frequency characteristics of gains obtained by simulation for the reference circuit and the common mode signal suppressing circuit of FIG. 6.

Reference is now made to FIG. 9 to describe the result of determining the relationship between the effect of suppressing common mode signals and the coupling coefficient between the winding 13 and the windings 11 and 12 of the common mode signal suppressing circuit of FIG. 6 by simulation. FIG. 9 shows frequency characteristics of gains obtained by simulation for the above-mentioned reference circuit and the common mode signal suppressing circuit of FIG. 6.

Lines of FIG. 9 indicated with numerals 41 and 42 show the characteristics of the reference circuit under the conditions the same as those in the cases for the lines of FIG. 8 indicated with numerals 31 and 32.

Lines of FIG. 9 indicated with numerals 43 to 46 show the characteristics of the common mode signal suppressing circuit of FIG. 6. In the simulation, the capacitance of the capacitors 51 and 52 is 1000 pF, and the inductance of each of the windings 11, 12, 13, 61 and 62 is 30 μH. The lines with numerals 43 to 46 show the characteristics obtained in the cases in which the coupling coefficients between the winding 13 and the windings 11 and 12 are 0.7, 0.9, 0.995, and 1, respectively.

Consideration will now be given to the result of the simulation shown in FIG. 9. First, in the common mode signal suppressing circuit, if the coupling coefficient is 0.7 or greater, a greater effect of suppressing common mode signals is obtained, compared with the reference circuit. As the coupling coefficient increases, the effect of suppressing common mode signals is enhanced. FIG. 9 being considered, the coupling coefficient should preferably be 0.7 or greater, and more preferably be 0.9 or greater, and still more preferably be 0.995 or greater.

According to the common mode signal suppressing circuit of the embodiment as thus described, it is possible to suppress common mode signals in a wider frequency range more effectively, compared with the common mode signal suppressing circuit of the first embodiment.

The remainder of configuration, operations and effects of the second embodiment are similar to those of the first embodiment.

THIRD EMBODIMENT

Figure 10:
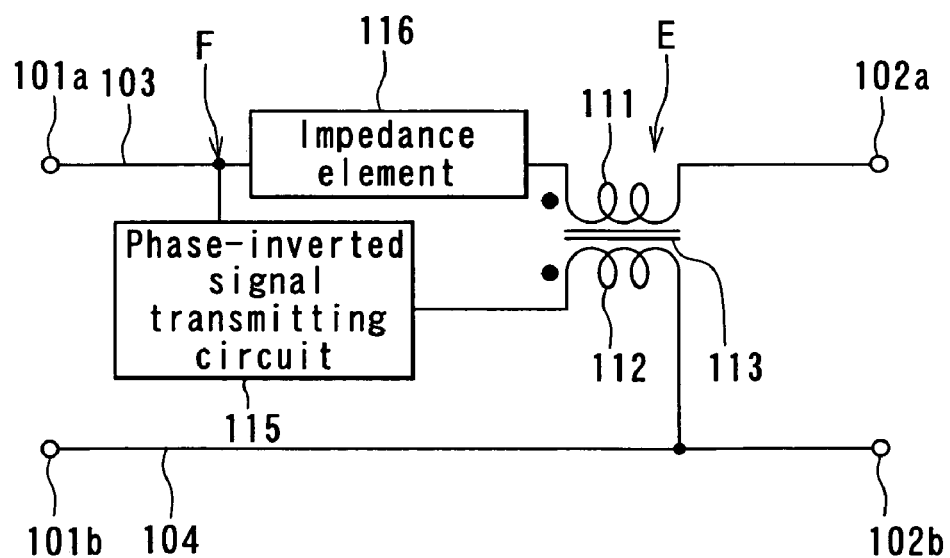
FIG. 10 is a schematic diagram illustrating a basic configuration of a normal mode signal suppressing circuit of a third embodiment of the invention.

FIG. 10 is a schematic diagram illustrating a basic configuration of a normal mode signal suppressing circuit of a third embodiment of the invention. The normal mode signal suppressing circuit of the third embodiment comprises a pair of terminals 101*a* and 101*b*, another pair of terminals 102*a* and 102*b*, a conductor line 103 connecting the terminals 101*a* and 102*a* to each other, and a conductor line 104 connecting the terminals 101*b* and 102*b* to each other. The normal mode signal suppressing circuit is designed to be connected to a power line for transmitting alternating current power or direct current power. The power line includes two power conductor lines. The normal mode signal suppressing circuit is designed to be inserted somewhere along the two power conductor lines. The terminals 101*a* and 102*a* are connected to one of the power conductor lines while the terminals 101*b* and 102*b* are connected to the other of the power conductor lines. A source of normal mode signals to be suppressed by the normal mode signal suppressing circuit is connected to the terminals 101*a* and 101*b* or the terminals 102*a* and 102*b*. Therefore, the normal mode signals to be suppressed are inputted to the normal mode signal suppressing circuit from the terminals 101*a* and 101*b* or the terminals 102*a* and 102*b*.

Here, the normal mode signals are signals transmitted by the two power conductor lines and creating a potential difference between the two power conductor lines. The normal mode signals to be suppressed include noise and unwanted communications signals.

The normal mode signal suppressing circuit further comprises: a first inductance element 111 inserted to the conductor line 103 at a specific first point E; and a second inductance element 112 coupled to the first inductance element 111 through a magnetic core 113 such that a mutual inductance is generated between the second inductance element 112 and the first inductance element 111. The inductance elements 111 and 112 have windings, and the turns ratio of the windings may be 1:1, for example.

The normal mode signal suppressing circuit further comprises a phase-inverted signal transmitting circuit 115 connected to the second inductance element 112 and to the conductor line 103 at a point F different from the first point E. The phase-inverted signal transmitting circuit 115 transmits phase-inverted signals for suppressing normal mode signals. The phase-inverted signal transmitting circuit 115 has an end connected to the conductor line 103 at the point F. The circuit 115 has the other end connected to an end of the second inductance element 112. The other end of the second inductance element 112 is connected to the conductor line 104. The phase-inverted signal transmitting circuit 115 corresponds to the phase-inverted signal transmitting means of the invention.

The normal mode signal suppressing circuit further comprises an impedance element 116 that is provided at a point on the conductor line 103 between the first point E and the second point F and that reduces the peak value of a normal mode signal passing therethrough.

Figure 11:
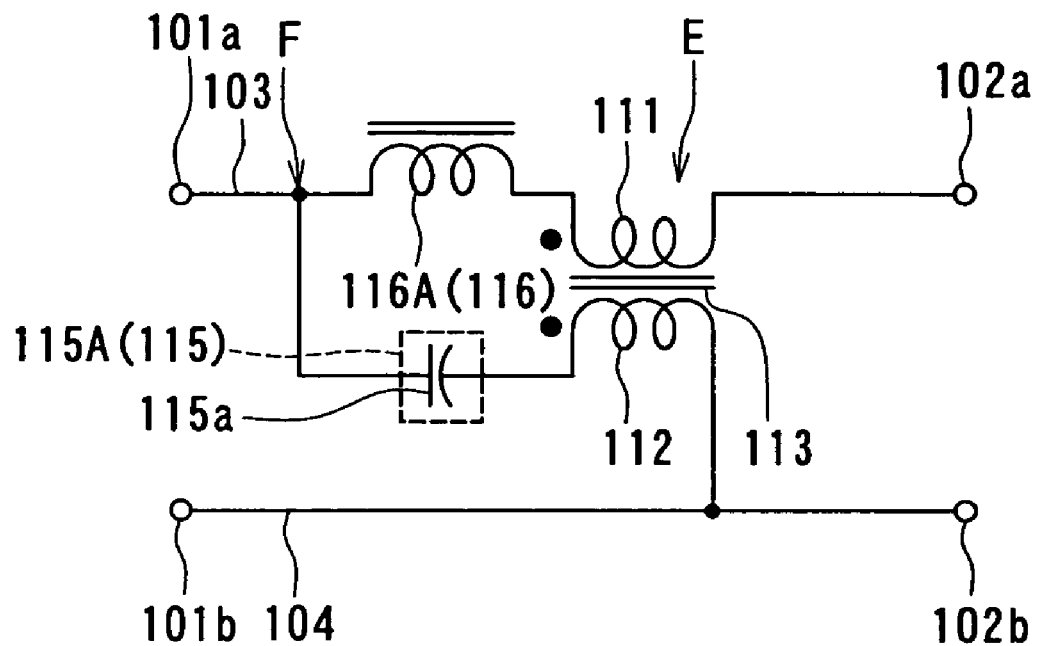
FIG. 11 is a schematic diagram illustrating a specific example of configuration of the normal mode signal suppressing circuit of FIG. 10.

FIG. 11 is a schematic diagram illustrating a specific example of configuration of the normal mode signal suppressing circuit of FIG. 10. In this example, the phase-inverted signal transmitting circuit 115 is made up of a high-pass filter 115A for allowing signals having a specific frequency or higher to pass among normal mode signals or phase-inverted signals. The high-pass filter 115A includes a capacitor 115a. The capacitor 115a has an end connected to the conductor line 103 at the point F. The capacitor 115a has the other end connected to an end of the second inductance element 112.

In the example shown in FIG. 11, the impedance element 116 is made up of a third inductance element 116A. The third inductance element 116A has an end connected to the terminal 101a and the other end connected to an end of the first inductance element 111.

The operation of the normal mode signal suppressing circuit of the embodiment will now be described. First, the operation of the normal mode signal suppressing circuit will be described, wherein the normal mode signal source is located at a point closer to the second point F than the first point E except a point between the first point E and the second point F. In this case, the phase-inverted signal transmitting circuit 115 detects a normal mode signal on the conductor line 103 at the second point F, and supplies a phase-inverted signal to the second inductance element 112, the phase-inverted signal having a phase opposite to the phase of the normal mode signal detected. The second inductance element 112 injects the phase-inverted signal to the conductor line 103 at the first point E through the first inductance element 111. As a result, the normal mode signal is suppressed on a portion of the conductor line 103 from the first point E onward along the direction of travel of the normal mode signal.

Next, the operation of the normal mode signal suppressing circuit will be described, wherein the normal mode signal source is located at a point closer to the first point E than the second point F except a point between the first point E and the second point F. In this case, the second inductance element 112 detects a normal mode signal on the conductor line 103 at the first point E. The phase-inverted signal transmitting circuit 115 injects a phase-inverted signal to the conductor line 103 at the second point F, the phase-inverted signal having a phase opposite to the phase of the normal mode signal detected by the second inductance element 112. As a result, the normal mode signal is suppressed on a portion of the conductor line 103 from the second point F onward along the direction of travel of the normal mode signal.

According to the embodiment, the impedance element 116 reduces the peak value of a signal passing therethrough. As a result, the difference between the peak value of the normal mode signal propagating via the impedance element 116 and the peak value of the phase-inverted signal injected to the conductor line 103 via the phase-inverted signal transmitting circuit 115 is reduced.

Figure 12:
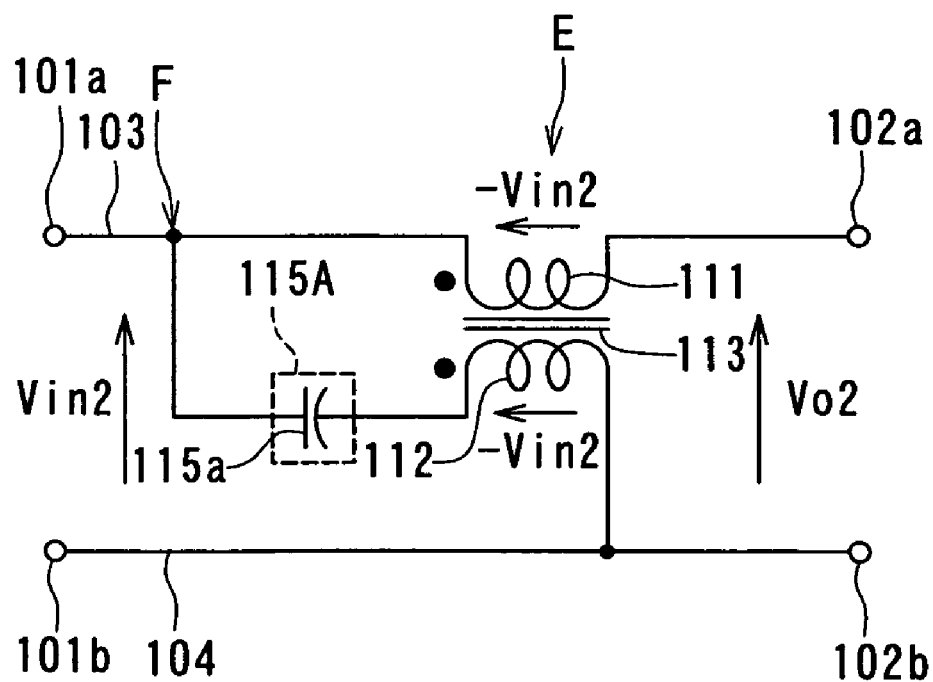
FIG. 12 is a schematic diagram illustrating the configuration of FIG. 11 from which the third inductance element is removed.

Reference is now made to FIG. 12 to describe the principle of suppression of normal mode signals by the normal mode signal suppressing circuit of the embodiment. Here, a case will be described wherein the normal mode signal source is located at a point closer to the second point F than the first point E. FIG. 12 illustrates the configuration of FIG. 11 from which the third inductance element 116A is removed. In the following description, it is assumed that the impedance of the high-pass filter 115A (the capacitor 115a) is zero, the turns ratio between the first inductance element 111 and the second inductance element 112 is 1:1, for example, and the coupling coefficient between the first inductance element 11l and the second inductance element 112 is 1.

It is assumed that, in the circuit of FIG. 12, a normal mode signal that creates a potential difference Vin2 between the terminals 101a and 101b is inputted to the terminals 101a and 101b. If the normal mode signal has a frequency within the pass band of the high-pass filter 115A, the normal mode signal passes through the high-pass filter 115A, and a phase shift of 180 degrees occurs at the same time by means of the operation of the capacitor 115a. As a result, a potential difference −Vin2 is created between the ends of the second inductance element 112. A potential difference −Vin2 is also created between the ends of the first inductance element 111 in accordance with the potential difference −Vin2 created between the ends of the second inductance element 112. This is expressed by the equation below where the potential difference between the terminals 102a and 102b is Vo2.

$$Vo2 = Vin2 + (-Vin2) = 0$$

According to the circuit of FIG. 12 as thus described, as long as the impedance of the high-pass filter 115A is zero and the coupling coefficient between the first inductance element 111 and the second inductance element 112 is 1, it is possible to completely remove normal mode signals at any frequency within the pass band of the high-pass filter 115A.

In practice, however, it is impossible that the impedance of the high-pass filter 115A is zero, and the impedance varies in response to the frequency. In particular, if the high-pass filter 115A is made up of the capacitor 115a, a series resonant circuit is made up of the capacitor 115a and the second inductance element 112. Therefore, the impedance of the signal path including the capacitor 115a and the second inductance element 112 is reduced only in a narrow frequency range around the resonant frequency of the series resonant circuit. As a result, the circuit of FIG. 12 is capable of removing normal mode signals only in a narrow frequency range.

In addition, the coupling coefficient between the first inductance element 111 and the second inductance element 112 is smaller than 1 in practice. Therefore, it is impossible that voltage of a value the same as that of the voltage supplied to the second inductance element 112 is generated at the first inductance element 111.

Because of the foregoing reasons, the circuit of FIG. 12 is not capable of effectively suppressing normal mode signals in a wide frequency range.

According to the normal mode signal suppressing circuit of the embodiment, the impedance element 116 is provided on the conductor line 103 between the first point E and the second point F so as to reduce the peak value of a normal mode signal passing therethrough. As a result, in the normal mode signal suppressing circuit, the difference between the peak value of the normal mode signal propagating via the impedance element 116 and the peak value of the phase-inverted signal injected to the conductor line 103 via the phase-inverted signal transmitting circuit 115 is reduced. As a result, according to the normal mode signal suppressing circuit, it is possible to effectively suppress normal mode signals in a wide frequency range.

Figure 13:
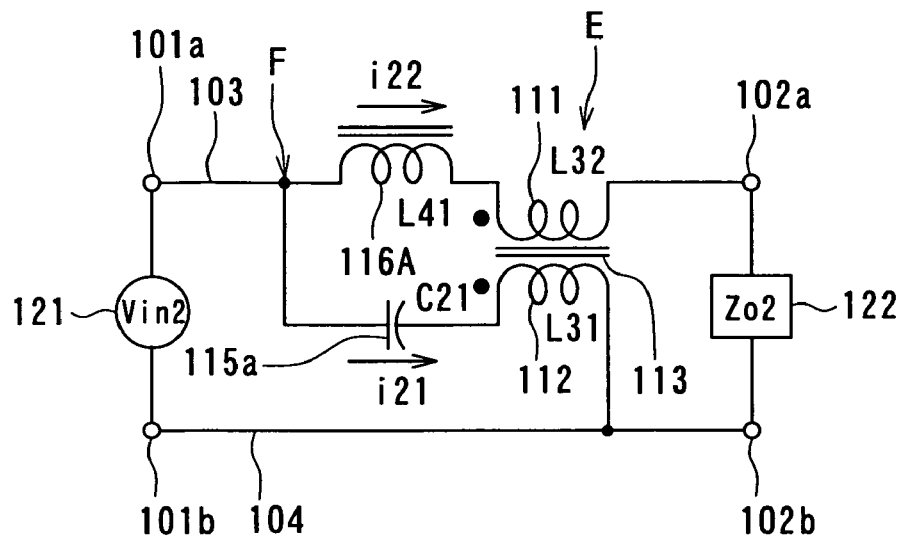
FIG. 13 is a schematic diagram illustrating a circuit made up of the normal mode signal suppressing circuit of FIG. 11 to which a normal mode signal source and a load are connected.

Reference is now made to FIG. 13 to describe details of the operation of the normal mode signal suppressing circuit of the embodiment. FIG. 13 illustrates a circuit in which a normal mode signal source 121 and a load 122 are connected to the normal mode signal suppressing circuit of FIG. 11. The normal mode signal source 121 is connected between the terminals 101*a* and 101*b*, and creates a potential difference Vin2 between the terminals 101*a* and 101*b*. The load 122 is connected between the terminals 102*a* and 102*b*, and has an impedance Zo2.

In the circuit of FIG. 13, the inductance of the second inductance element 112 is L31, the inductance of the first inductance element 111 is L32, the capacitance of the capacitor 115*a* is C21, and the inductance of the third inductance element 116A is L41. The current passing through the capacitor 115*a* and the second inductance element 112 is 'i21', and the sum of impedances on the path of the current i21 is Z3. The current passing through the third inductance element 116A and the first inductance element 111 is 'i22', and the sum of impedances on the path of the current i22 is Z4.

The mutual inductance between the first inductance element 111 and the second inductance element 112 is M, and the coupling coefficient between the first inductance element 111 and the second inductance element 112 is K. The coupling coefficient K is expressed by the following equation (9).

$$K = M/\sqrt{(L31 \cdot L32)} \quad (9)$$

The above-mentioned sums Z3 and Z4 of impedances are expressed by the following equations (10) and (11), respectively, where 'j' indicates $\sqrt{(-1)}$, and 'ω' indicates the angular frequency of the normal mode signal.

$$Z3 = j(\omega L31 - 1/\omega C21) \quad (10)$$

$$Z4 = Zo2 + j\omega(L32 + L41) \quad (11)$$

The potential difference Vin2 is expressed by the following equations (12) and (13).

$$Vin2 = Z3 \cdot i21 + j\omega M \cdot i22 \quad (12)$$

$$Vin2 = Z4 \cdot i22 + j\omega M \cdot i21 \quad (13)$$

Based on the equations (10) to (13), an equation that expresses the current 'i22' without including the current 'i21' will be obtained below. First, the following equation (14) is obtained from the equation (12).

$$i21 = (Vin2 - j\omega M \cdot i22)/Z3 \quad (14)$$

Next, the equation (14) is substituted into the equation (13), and the following equation (15) is thereby obtained.

$$i22 = Vin2(Z3 - j\omega M)/(Z3 \cdot Z4 + \omega^2 \cdot M^2) \quad (15)$$

To suppress the normal mode signal by the normal mode signal suppressing circuit of FIG. 13 means a reduction in current 'i22' expressed by the equation (15). According to the equation (15), the current 'i22' is reduced if the denominator of the right side of the equation (15) increases. Consideration will now be given to the denominator $(Z3 \cdot Z4 + \omega^2 \cdot M^2)$ of the right side of the equation (15).

First, since Z3 is expressed by the equation (10), Z3 increases as the inductance L31 of the second inductance element 112 increases, and Z3 increases as the capacitance C21 of the capacitor 115*a* increases.

Next, since Z4 is expressed by the equation (11), Z4 increases as the sum of the inductance L32 of the first inductance element 111 and the inductance L41 of the third inductance element 116A increases. Therefore, the current 'i22' is reduced if at least one of the inductance L32 and the inductance L41 is increased. The equation (15) indicates that, although it is possible to suppress normal mode signals only by the first inductance element 111, it is possible to suppress normal mode signals more effectively if the third inductance element 116A is added.

Since the denominator of the right side of the equation (15) includes $\omega^2 \cdot M^2$, the current 'i22' is reduced by increasing the mutual inductance M. As shown in the equation (9), the coupling coefficient K is proportional to the mutual inductance M. Therefore, if the coupling coefficient K is increased, the effect of suppressing normal mode signals by the normal mode signal suppressing circuit of FIG. 13 is enhanced. Since the mutual inductance M is included in a form of square in the denominator of the right side of the equation (15), the effect of suppressing normal mode signals greatly varies, depending on the value of coupling coefficient K.

If the normal mode signal source is located closer to the first point E than the second point F, the roles of the second inductance element 112 and the phase-inverted signal transmitting circuit 115 are the reverse of the roles described with reference to FIG. 12 and FIG. 13. However, the foregoing description similarly applies to such a case, too.

Figure 14:
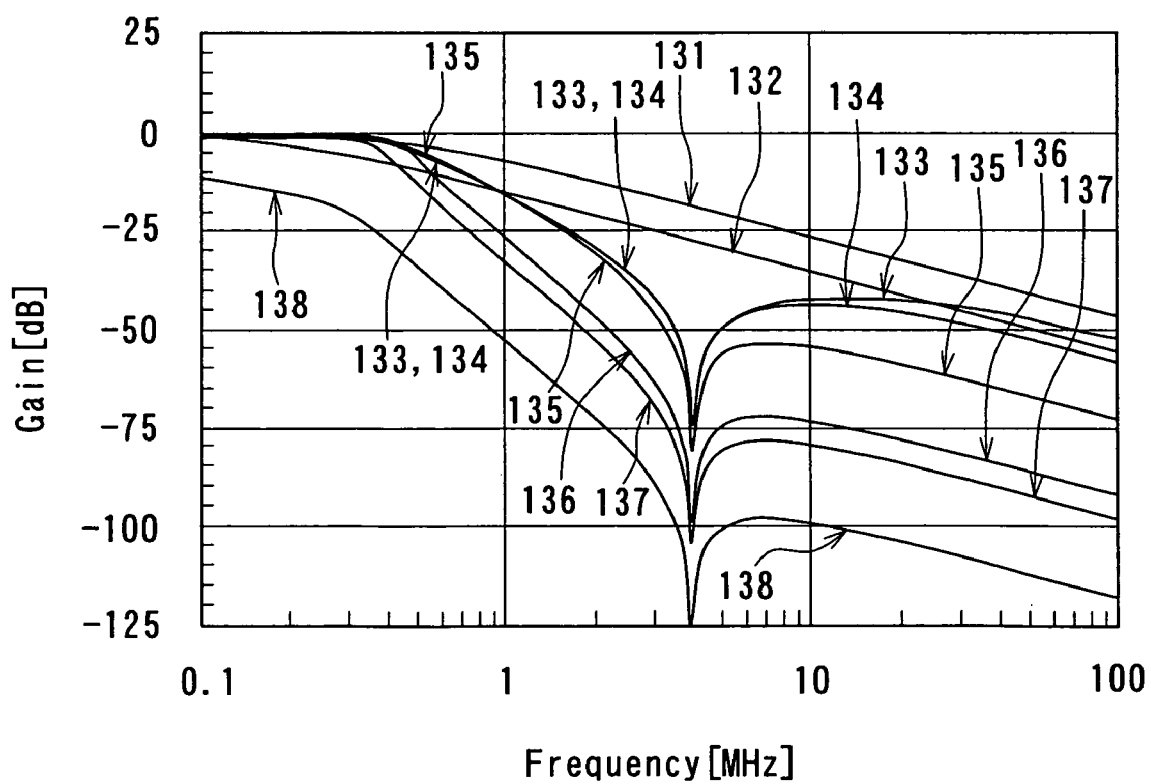
FIG. 14 is a plot showing frequency characteristics of gains obtained by simulation for a reference circuit and the normal mode signal suppressing circuit of FIG. 11.

Reference is now made to FIG. 14 to describe the result of determining the relationship between the effect of suppressing normal mode signals and the inductance of the third inductance element 116A of the normal mode signal suppressing circuit of FIG. 11 by simulation. FIG. 14 shows frequency characteristics of gains obtained by simulation for a reference circuit and the normal mode signal suppressing circuit of FIG. 11.

The reference circuit comprises: a pair of terminals 101*a* and 101*b*; another pair of terminals 102*a* and 102*b*; and an inductance element having an end connected to the terminal 101*a* and the other end connected to the terminal 102*a*. A line of FIG. 14 indicated with numeral 131 shows the characteristic of the reference circuit when the inductance of the above-mentioned inductance element is 33 µH. A line of FIG. 14 indicated with numeral 132 shows the characteristic of the reference circuit when the inductance of the inductance element is 90 µH.

Lines of FIG. 14 indicated with numerals 133 to 138 show the characteristics of the normal mode signal suppressing circuit of FIG. 11. In the simulation, the capacitance of the capacitor 115*a* is 0.01 µF, the inductance of each of the first inductance element 111 and the second inductance element 112 is 30 µH, and the coupling coefficient between the first inductance element 111 and the second inductance element 112 is 0.995. The value of 0.995 is a value that can be obtained as the coupling coefficient.

In the simulation no difference in characteristic of the normal mode signal suppressing circuit is observed between the case in which the normal mode signal source is located at a point closer to the first point E and the case in which the normal mode signal source is located at a point closer to the second point F.

The line indicated with numeral 133 shows the characteristic obtained when the inductance of the third inductance element 116A is zero. The configuration of the normal mode signal suppressing circuit of FIG. 11 in this case is the same as the configuration of the circuit of FIG. 12. The line indicated with numeral 134 shows the characteristic obtained when the inductance of the third inductance element 116A is 0.3 µH. The line indicated with numeral 135 shows the characteristic obtained when the inductance of the third inductance element 116A is 3 µH. The line indicated with numeral 136 shows the characteristic obtained when the inductance of the third inductance element 116A is 30 µH. The line indicated with numeral 137 shows the characteristic obtained when the inductance of the third inductance element 116A is 60 µH. The line indicated with numeral 138 shows the characteristic obtained when the inductance of the third inductance element 116A is 600 µH.

The result of the simulation shown in FIG. 14 will now be considered. First, the following facts will be obtained from the comparison between the lines indicated with numerals 132 and 135. The normal mode signal suppressing circuit wherein the inductance of the first inductance element 111 is 30 µH, the inductance of the third inductance element 116A is 3 µH, and the sum of these inductances is 33 µH has a greater effect of suppressing normal mode signals in a frequency range of 1 MHz and higher, compared with the reference circuit wherein the inductance of the inductance element is 90 µH. Because of this feature, according to the embodiment, it is possible to make the inductance element smaller, compared with the reference circuit, and it is thereby possible to reduce the entire circuit in size.

If the lines with numerals 133 to 138 are compared, it is noted that a greater effect of suppressing normal mode signals is obtained as the inductance of the third inductance element 116A increases. However, the third inductance element 116A is increased in dimensions as the inductance of the third inductance element 116A increases. Therefore, if the inductance of the third inductance element 116A exceeds 600 µH, the practicality is reduced. It is noted that, when the inductance of the first inductance element 111 is 30 µH, a sufficient effect of suppressing normal mode signals is obtained as long as the inductance of the third inductance element 116A is 30 or 60 µH. These findings indicate that it is sufficient that the inductance of the third inductance element 116A is 30 or 60 µH. In addition, it is preferred that the inductance of the third inductance element 116A is of a value similar to that of the first inductance element 111.

As the comparison between the lines with numerals 131 and 134 indicates, it is possible to obtain the effect of suppressing normal mode signals even if the inductance of the third inductance element 116A is around 0.3 µH.

The consideration of FIG. 14 indicates that the inductance of the third inductance element 116A should preferably fall within a range of 0.3 µH to 600 µH inclusive, more preferably within a range of 3 µH to 60 µH inclusive, and still more preferably within a range of 3 µH to 30 µH inclusive.

Figure 15:
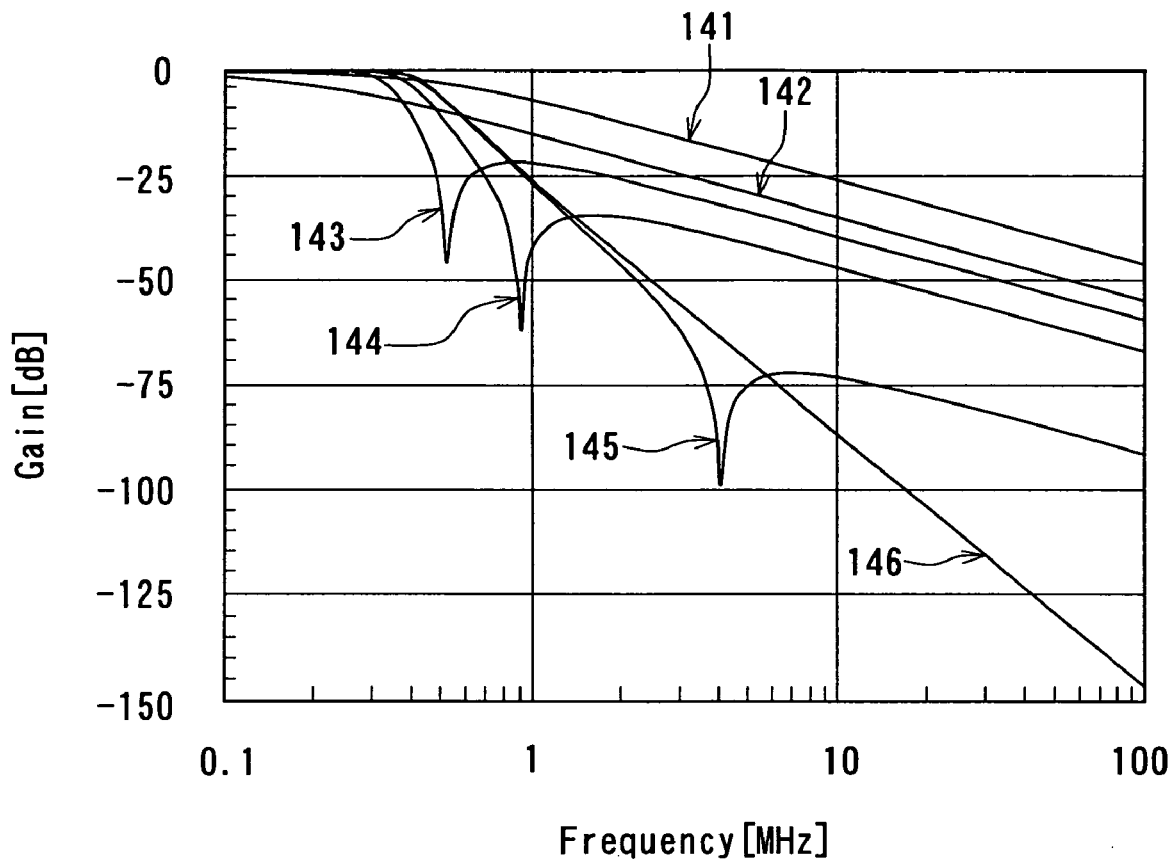
FIG. 15 is a plot showing frequency characteristics of gains obtained by simulation for the reference circuit and the normal mode signal suppressing circuit of FIG. 11.

Reference is now made to FIG. 15 to describe the result of determining the relationship between the effect of suppressing normal mode signals and the coupling coefficient between first inductance element 111 and the second inductance element 112 of the normal mode signal suppressing circuit of FIG. 11 by simulation. FIG. 15 shows frequency characteristics of gains obtained by simulation for the above-mentioned reference circuit and the normal mode signal suppressing circuit of FIG. 11.

Lines of FIG. 15 indicated with numerals 141 and 142 show the characteristics of the reference circuit under the conditions the same as those in the cases for the lines of FIG. 14 indicated with numerals 131 and 132.

Lines of FIG. 15 indicated with numerals 143 to 146 show the characteristics of the normal mode signal suppressing circuit of FIG. 11. In the simulation, the capacitance of the capacitor 115a is 0.01 µF, and the inductance of each of the first inductance element 111, the second inductance element 112 and the third inductance element 116A is 30 µH. The lines with numerals 143 to 146 show the characteristics obtained in the cases in which the coupling coefficients between the first inductance element 111 and the second inductance element 112 are 0.7, 0.9, 0.995, and 1, respectively.

Consideration will now be given to the result of the simulation shown in FIG. 15. First, in the normal mode signal suppressing circuit, if the coupling coefficient is 0.7 or greater, a greater effect of suppressing normal mode signals is obtained, compared with the reference circuit. As the coupling coefficient increases, the effect of suppressing normal mode signals is enhanced. FIG. 15 being considered, the coupling coefficient should preferably be 0.7 or greater, and more preferably be 0.9 or greater, and still more preferably be 0.995 or greater.

According to the embodiment as thus described, it is possible to implement the normal mode signal suppressing circuit capable of suppressing normal mode signals in a wide frequency range effectively, and achieving a reduction in size.

According to the embodiment, it is possible to implement the normal mode signal suppressing circuit that has a greater effect of suppressing normal mode signals although it has a smaller number of components than the conventional EMI filter does and is inexpensive.

According to the embodiment, if the phase-inverted signal transmitting circuit 115 is made up of the capacitor 115a, it is possible only by the capacitor 115a to perform detection of normal mode signals and generation of a phase-inverted signal having a phase opposite to that of the normal mode signal detected. As a result, the number of components is further reduced in this case.

The normal mode signal suppressing circuit of the embodiment may be used as a means for reducing a ripple voltage and noise developed by a power transformer circuit, or a means for avoiding communications signals on an indoor power line from leaking to an outdoor power line.

FOURTH EMBODIMENT

Figure 16:
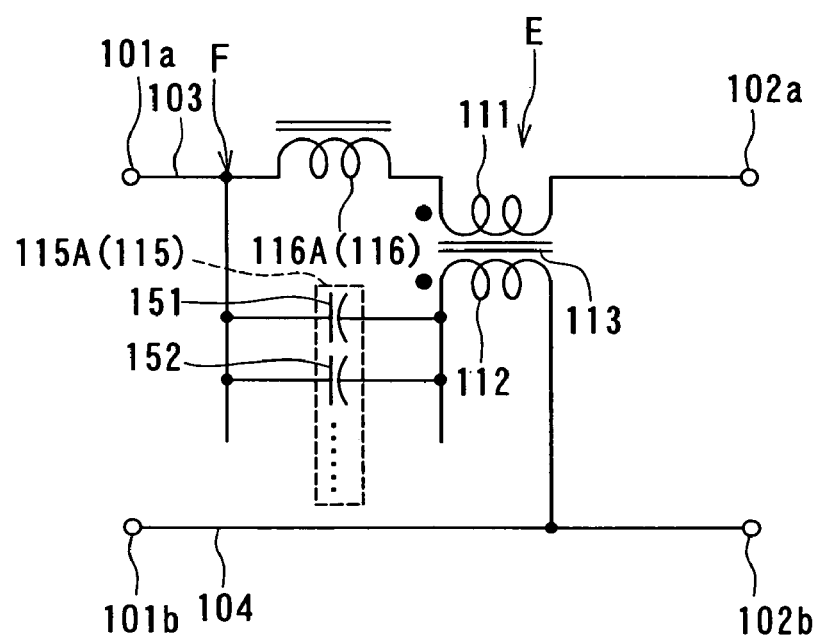
FIG. 16 is a schematic diagram illustrating a configuration of a normal mode signal suppressing circuit of a fourth embodiment of the invention.
Figure 17:
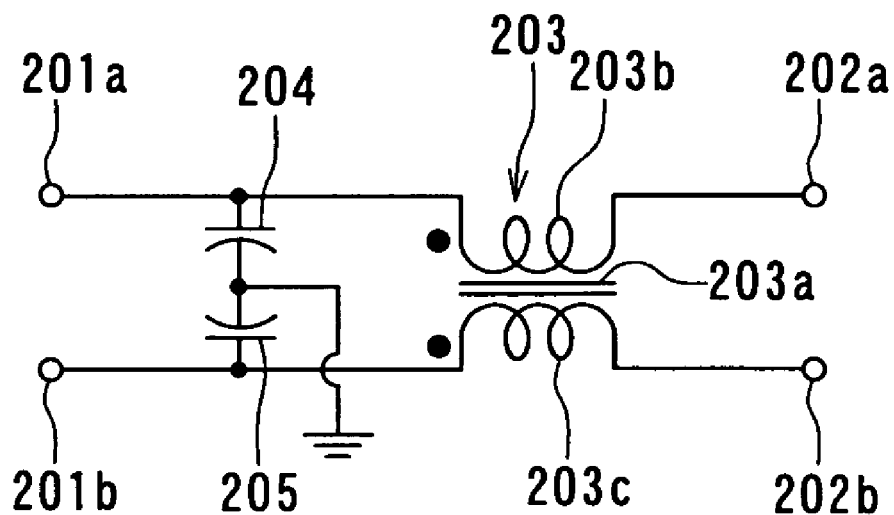
FIG. 17 is a schematic diagram illustrating an example of configuration of an LC filter for reducing common mode noise.
Figure 18:
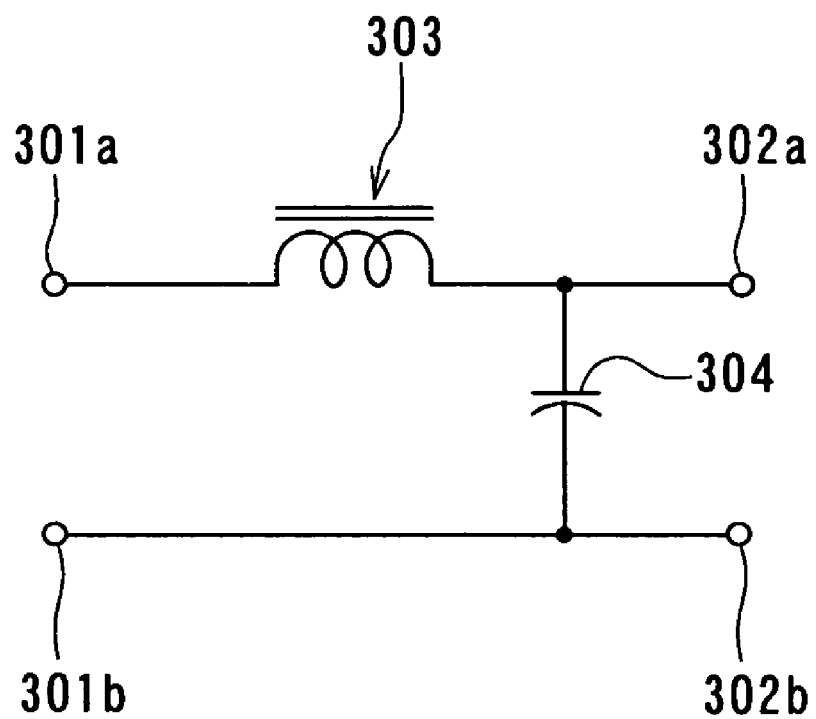
FIG. 18 is a schematic diagram illustrating an example of configuration of an LC filter for reducing normal mode noise.

FIG. 16 is a schematic diagram illustrating the configuration of a normal mode signal suppressing circuit of a fourth embodiment of the invention. The basic configuration of the normal mode signal suppressing circuit of the fourth embodiment is the same as that of the third embodiment. A difference between the fourth and third embodiments is that the high-pass filter 115A as the phase-inverted signal transmitting circuit 115 of the fourth embodiment incorporates a plurality of capacitors 151, 152, . . . that are combined. It is acceptable that the number of capacitors incorporated in the high-pass filter 115A is two or greater.

Each of the capacitors 151, 152, . . . has an end connected to the conductor line 103 at the second point F, and the other end connected to an end of the second inductance element 112. Therefore, the capacitors 151, 152, . . . are connected to one another in parallel. The capacitors 151, 152, . . . have different capacitances. The high-pass filter 115A incorporating such capacitors 151, 152, . . . makes it possible that the high-pass filter 115A is designed to have a desired frequency characteristic. For example, according to the high-pass filter 115A of the fourth embodiment, it is possible to design the frequency characteristic of the high-pass filter 115A such that the pass band is wider than that of the high-pass filter 115A of the third embodiment.

The remainder of configuration, operations and effects of the fourth embodiment are similar to those of the third embodiment.

The present invention is not limited to the foregoing embodiments but may be practiced in still other ways. For example, each of the phase-inverted signal transmitting circuits 15 and 115 is not limited to a high-pass filter but may be a band-pass filter.

As thus described, according to the common mode signal suppressing circuit of the invention, it is possible to implement the common mode signal suppressing circuit capable of effectively suppressing common mode signals in a wide frequency range and achieving a reduction in size.

According to the normal mode signal suppressing circuit of the invention, it is possible to implement the normal mode signal suppressing circuit capable of effectively suppressing normal mode signals in a wide frequency range and achieving a reduction in size.

Obviously many modifications and variations of the present invention are possible in the light of the above teachings. It is therefore to be understood that within the scope of the appended claims the invention may be practiced otherwise than as specifically described.

The invention claimed is:

1. A common mode signal suppressing circuit for suppressing common mode signals propagating with identical phases through two conductor lines, the common mode signal suppressing circuit comprising:
 a first winding inserted to one of the conductor lines at a specific first point:
 a second winding that is inserted to the other of the conductor lines at a second point corresponding to the first point and is coupled to the first winding, the second winding suppressing the common mode signals in cooperation with the first winding;
 a third winding coupled to the first and second windings such that a mutual inductance is generated between the third winding and the first and second windings; and
 a phase-inverted signal transmitting means connected to the third winding and to the one of the conductor lines at a third point different from the first point, the transmitting means being further connected to the other of the conductor lines at a fourth point corresponding to the third point and different from the second point, the transmitting means transmitting a phase-inverted signal for suppressing the common mode signals, wherein:
 when a source of the common mode signals is located at a point closer to the third and fourth points than the first and second points except a point between the first and third points and a point between the second and fourth points, the transmitting means detects a common mode signal and supplies the phase-inverted signal to the third winding, the phase-inverted signal having a phase opposite to a phase of the common mode signal detected, and the third winding injects the phase-inverted signal to the two conductor lines through the first and second windings; and
 when the source of the common mode signals is located at a point closer to the first and second points than the third and fourth points except a point between the first and third points and a point between the second and fourth points, the third winding detects a common mode signal, and the transmitting means injects the phase-inverted signal to the two conductor lines, the phase-inverted signal having a phase opposite to a phase of the common mode signal detected by the third winding,
 the common mode signal suppressing circuit, further comprising an impedance element provided on the two conductor lines at a point between the first and third points and a point between the second and fourth points, the impedance element reducing a peak value of a common mode signal passing therethrough.

2. The common mode signal suppressing circuit according to claim 1, wherein the phase-inverted signal transmitting means incorporates a high-pass filter for allowing a common mode signal to pass therethrough.

3. The common mode signal suppressing circuit according to claim 2, wherein the high-pass filter incorporates a capacitor.

4. The common mode signal suppressing circuit according to claim 1, wherein the impedance element incorporates:
 a fourth winding inserted to one of the conductor lines; and
 a fifth winding that is inserted to the other of the conductor lines and coupled to the fourth winding and that suppresses the common mode signals in cooperation with the fourth winding.

5. The common mode signal suppressing circuit according to claim 4, wherein each of the fourth and fifth windings has an inductance of 0.3 µH or greater.

6. A common mode signal suppressing circuit for suppressing common mode signals propagating with identical phases through two conductor lines, the common mode signal suppressing circuit comprising:
 a first winding inserted to one of the conductor lines at a specific first point;
 a second winding that is inserted to the other of the conductor lines at a second point corresponding to the first point and is coupled to the first winding, the second winding suppressing the common mode signals in cooperation with the first winding;
 a third winding coupled to the first and second windings such that a mutual inductance is generated between the third winding and the first and second windings; and
 a phase-inverted signal transmitting means connected to the third winding and to the one of the conductor lines at a third point different from the first point, the transmitting means being further connected to the other of the conductor lines at a fourth point corresponding to the third point and different from the second point, the transmitting means transmitting a phase-inverted signal for suppressing the common mode signals, wherein:
 when a source of the common mode signals is located at a point closer to the third and fourth points than the first and second points except a point between the first and third points and a point between the second and fourth points, the transmitting means detects a common mode signal and supplies the phase-inverted signal to the third winding, the phase-inverted signal having a phase opposite to a phase of the common mode signal detected, and the third winding injects the phase-inverted signal to the two conductor lines through the first and second windings;

when the source of the common mode signals is located at a point closer to the first and second points than the third and fourth points except a point between the first and third points and a point between the second and fourth points, the third winding detects a common mode signal, and the transmitting means injects the phase-inverted signal to the two conductor lines, the phase-inverted signal having a phase opposite to a phase of the common mode signal detected by the third winding; and a coupling coefficient between the third winding and the first and second windings is 0.7 or greater.

7. A normal mode signal suppressing circuit for suppressing normal mode signals transmitted by two conductor lines and creating a potential difference between the two conductor lines, the normal mode signal suppressing circuit comprising:

a first inductance element inserted to one of the conductor lines at a specific first point;

a second inductance element coupled to the first inductance element such that a mutual inductance is generated between the first and second inductance elements;

a phase-inverted signal transmitting means connected to the second inductance element and to the one of the conductor lines at a second point different from the first point, the transmitting means transmitting a phase-inverted signal for suppressing the normal mode signals; and an impedance element provided on the one of the conductor lines at a point between the first and second points, the impedance element reducing a peak value of a normal mode signal passing therethrough, wherein:

when a source of the normal mode signals is located at a point closer to the second point than the first point except a point between the first and second points, the transmitting means detects a normal mode signal and supplies the phase-inverted signal to the second inductance element, the phase-inverted signal having a phase opposite to a phase of the normal mode signal detected, and the second inductance element injects the phase-inverted signal to the one of the conductor lines through the first inductance element; and when the source of the normal mode signals is located at a point closer to the first point than the second point except a point between the first and second points, the second inductance element detects a normal mode signal, and the transmitting means injects the phase-inverted signal to the one of the conductor lines, the phase-inverted signal having a phase opposite to a phase of the normal mode signal detected by the second inductance element.

8. The normal mode signal suppressing circuit according to claim 7, wherein the phase-inverted signal transmitting means incorporates a high-pass filter for allowing a normal mode signal to pass therethrough.

9. The normal mode signal suppressing circuit according to claim 8, wherein the high-pass filter incorporates a capacitor.

10. The normal mode signal suppressing circuit according to claim 8, wherein the high-pass filter incorporates a plurality of capacitors that are combined.

11. The normal mode signal suppressing circuit according to claim 7, wherein the impedance element incorporates a third inductance element inserted to the one of the conductor lines.

12. The normal mode signal suppressing circuit according to claim 11, wherein the third inductance element has an inductance of 0.3 µH or greater.

13. The normal mode signal suppressing circuit according to claim 7, wherein a coupling coefficient between the first and second inductance elements is 0.7 or greater.

* * * * *